(12) United States Patent
Ikegami et al.

(10) Patent No.: US 10,069,045 B2
(45) Date of Patent: Sep. 4, 2018

(54) METHOD OF MANUFACTURING LIGHT EMITTING DEVICE

(71) Applicant: NICHIA CORPORATION, Anan-shi, Tokushima (JP)

(72) Inventors: Takeshi Ikegami, Anan (JP); Tadao Hayashi, Tokushima (JP); Hiroto Tamaki, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/483,269

(22) Filed: Apr. 10, 2017

(65) Prior Publication Data

US 2017/0213941 A1  Jul. 27, 2017

Related U.S. Application Data

(62) Division of application No. 14/561,626, filed on Dec. 5, 2014, now Pat. No. 9,653,659.

(30) Foreign Application Priority Data

Dec. 6, 2013 (JP) ................................. 2013-253474

(51) Int. Cl.
  *H01L 33/50* (2010.01)
  *H01L 33/48* (2010.01)
(52) U.S. Cl.
  CPC .......... *H01L 33/502* (2013.01); *H01L 33/486* (2013.01); *H01L 2933/0033* (2013.01); *H01L 2933/0041* (2013.01)

(58) Field of Classification Search
  None
  See application file for complete search history.

(56) References Cited

U.S. PATENT DOCUMENTS

2007/0164300 A1    7/2007  Nabeta et al.
2008/0150416 A1*   6/2008  Maruyama ............. H01J 9/221
                                                 313/503

(Continued)

FOREIGN PATENT DOCUMENTS

JP      2002-043623 A    2/2002
JP      2002-118293 A    4/2002

(Continued)

*Primary Examiner* — Fazli Erdem
*Assistant Examiner* — Scott R Wilson

(57) ABSTRACT

A method of manufacturing a light emitting device including: forming a supporting body on a mounting surface of each of semiconductor light emitting elements; arranging the semiconductor light emitting elements to be spaced apart from each other by a predetermined distance; and forming a wavelength conversion layer to continuously cover an upper surface and side surfaces of at least one of the semiconductor light emitting elements. The forming the wavelength conversion layer includes spraying a slurry provided by mixing particles of a wavelength conversion member and a thermosetting resin in a solvent onto the upper surface and the side surfaces of the semiconductor light emitting element, so that a thickness of the wavelength conversion layer at a lower portion of the side surfaces of the supporting body is smaller than the thickness on the upper surface and the side surfaces of the semiconductor light emitting element.

4 Claims, 11 Drawing Sheets

(56) References Cited

U.S. PATENT DOCUMENTS

| | | |
|---|---|---|
| 2009/0179207 A1 | 7/2009 | Chitnis et al. |
| 2009/0289226 A1 | 11/2009 | Naum et al. |
| 2011/0297980 A1* | 12/2011 | Sugizaki ................. H01L 33/38 257/98 |
| 2013/0248915 A1 | 9/2013 | Shimada et al. |
| 2013/0264589 A1* | 10/2013 | Bergmann .............. H01L 33/62 257/88 |
| 2013/0277681 A1 | 10/2013 | Wada et al. |
| 2014/0071689 A1 | 3/2014 | Yoon et al. |
| 2014/0179042 A1 | 6/2014 | Chen et al. |
| 2015/0017750 A1 | 1/2015 | Sugizaki et al. |
| 2015/0024516 A1* | 1/2015 | Seibel, II ................ H01L 22/10 438/7 |
| 2015/0084080 A1 | 3/2015 | Kawakita et al. |

FOREIGN PATENT DOCUMENTS

| | | |
|---|---|---|
| JP | 2008-258334 A | 10/2008 |
| JP | 2008-300580 A | 12/2008 |
| JP | 2010-517289 A | 5/2010 |
| JP | 2010-177225 A | 8/2010 |
| JP | 2010-267646 A | 11/2010 |
| JP | 2011-253998 A | 12/2011 |
| JP | 2013-045824 A | 3/2013 |
| JP | 2013-105826 A | 5/2013 |
| JP | 2013-145829 A | 7/2013 |
| JP | 2013-225640 A | 10/2013 |
| WO | 2008-091319 A2 | 7/2008 |
| WO | 2013-038953 A1 | 3/2013 |

* cited by examiner

METHOD OF MANUFACTURING LIGHT EMITTING DEVICE

CROSS-REFERENCE TO RELATED APPLICATION

This application is a divisional application of U.S. patent application Ser. No. 14/561,626, filed on Dec. 5, 2014. This application claims priority to Japanese Patent Application No. 2013-253474, filed on Dec. 6, 2013. The entire disclosures of U.S. patent application Ser. No. 14/561,626 and Japanese Patent Application No. 2013-253474 are hereby incorporated herein by reference.

BACKGROUND OF THE INVENTION

1. Field of the Invention

The present disclosure relates to a light emitting device including a semiconductor light emitting element and a wavelength conversion layer, and to a method of manufacturing the same.

2. Description of Related Art

There has been a white diode configured to emit white light by combining an LED (light emitting diode) to emit blue light and a wavelength conversion layer (phosphor layer) which absorbs a portion of the blue light emitted from the LED and converts the light to light of a different wavelength such as yellow light, are used in combination so that white light can be produced by mixing the blue light and the yellow light.

A method of manufacturing the white light emitting diode includes a method of applying a resin containing a granular phosphor (wavelength conversion member) to an LED chip. For example, JP 2012-119673 A discloses a method by which many singulated LED chips are arranged apart from each other on a carrier substrate having a surface containing an adhesive agent, and a thermosetting resin containing a phosphor is applied onto an upper surface and a side surface of each of the LED chips by screen printing using a stencil mask. In addition, JP 2012-119673 A discloses a method by which the LED chips are arranged apart from each other on the carrier substrate, the thermosetting resin containing the phosphor is applied to the upper surface of each LED chip and between LED chips with a spray device, and singulated into individual pieces by dicing after the resin is cured.

Furthermore, JP 2003-69086 A discloses a method by which phosphor particles are uniformly attached on the LED chip by electrodeposition. That is, according to the method disclosed in JP 2003-69086 A, a wavelength conversion layer is formed by electrophoretically attaching the phosphor particles to the surface of the LED chip.

However, according to the method using the screen printing disclosed in JP 2012-119673 A, it is necessary to align the LED chips arranged on the carrier substrate with the stencil mask. Thus, if the LED chip is not correctly aligned with the stencil mask, it may result in occurrence of some regions where the wavelength conversion layer is not formed in the upper surface, and the wavelength conversion layer does not have a predetermined thickness on the side surface, so that uneven distribution of light color may occur. According to the other method, at the time of dicing the wavelength conversion layer applied to the LED chips, if the position to be diced is not accurate, the wavelength conversion layer provided on the side surface does not have a predetermined thickness, so that a distribution light color becomes uneven.

In addition, according to the method disclosed in JP 2003-69086 A, it has been difficult to form the wavelength conversion layer on a single LED chip body. If there can be prepared a supporting substrate of the LED chip having uniform in-plane electric resistance, it is theoretically possible to form a resin layer containing phosphor particles and having a uniform thickness by the electrodeposition, but it has been difficult to obtain the above supporting substrate. In addition, according to the method disclosed in JP 2003-69086 A, it is necessary to previously give electrical conductivity to an entire exposed surface of the LED chip to be used. Furthermore, according to the method using the electrophoresis, the element such as the LED chip needs to be soaked in an organic solvent for a long time, so that there are many restrictions in materials which can be used, and the method cannot be applied to various types of elements.

SUMMARY OF THE INVENTION

The present disclosure was made in view of the above problems, and it is an object of the present disclosure to provide a light emitting device which has a wavelength conversion layer made of a resin containing a phosphor, on a surface of a semiconductor light emitting element and which can reduce unevenness in distribution light color, and a method of manufacturing the light emitting device.

In order to solve the above problems, a light emitting device according to the embodiments of the present invention includes a semiconductor light emitting element, a supporting body for supporting the semiconductor light emitting element, and a wavelength conversion layer for continuously covering an upper surface and side surfaces of the semiconductor light emitting element, and side surfaces of the supporting body, in which a thickness of the wavelength conversion layer at least at a lower portion of each of the side surfaces of the supporting body is smaller than a thickness of the wavelength conversion layer on the upper surface and the side surfaces of the semiconductor light emitting element.

A method of manufacturing a light emitting device according to the embodiments of the present invention includes forming a supporting body on each mounting surface of a plurality of semiconductor light emitting elements, arranging the semiconductor light emitting elements each having the supporting body, spaced apart from each other by a predetermined distance with a side of the supporting body facing downward, and forming a wavelength conversion layer to continuously cover an upper surface and side surfaces of the semiconductor light emitting element having the supporting body, in which the forming the wavelength conversion layer further includes spraying a slurry provided by mixing particles of a wavelength conversion member and a thermosetting resin in a solvent onto the upper surface and the side surfaces of the semiconductor light emitting element having the supporting body, to form the wavelength conversion layer with a thickness at least at a lower portion of each of the side surfaces of the supporting body being smaller than the upper surface and the side surfaces of the semiconductor light emitting elements.

In a light emitting device according to the embodiments of the present invention, the wavelength conversion layer having the uniform thickness is formed on the upper surface and the side surfaces serving as a light extracting surface of the semiconductor light emitting element, and the wavelength conversion layer is not excessively formed at the lower portion of the side surfaces, so that it is possible to reduce the unevenness in distribution light color. In addition, in a method of manufacturing the light emitting device according to the embodiments of the present invention, spray coating is performed while elevating the semiconductor light emitting element with the supporting body, so that the wavelength conversion layer having a uniform thickness can be formed on the upper surface and the side surfaces serving as the light extracting surface of the semiconductor light emitting element. Furthermore, since the wavelength conversion layer at the lower side-surface portion can be thinly formed, the singulating after the formation of the wavelength conversion layer is not required or can be simply performed.

BRIEF DESCRIPTION OF THE DRAWINGS

FIGS. 1A and 1B are schematic cross-sectional views each showing a configuration of a light emitting device according to a first embodiment of the present invention, in which FIG. 1A shows a case where a growth substrate is provided, and FIG. 1B shows a case where the growth substrate is not provided.

FIGS. 2A and 2B are schematic views each showing a configuration in which the light emitting device according to the first embodiment of the present invention is mounted on a mounting substrate, in which FIG. 2A shows a plan view, and FIG. 2B shows a cross-sectional view taken along a line A-A in FIG. 2A.

FIGS. 4A to 4E are schematic cross-sectional views each showing a part of manufacturing steps in a method of manufacturing a light emitting device according to the first embodiment of the present invention, in which FIG. 4A shows that light emitting elements are formed, FIG. 4B shows that a resin layer is formed, FIG. 4C shows that through holes are formed in the resin layer, FIG. 4D shows that conductive members and pad electrode are formed, and FIG. 4E shows that light emitting elements are singulated.

FIGS. 5A to 5C are schematic cross-sectional views each showing a part of the manufacturing steps in the method of manufacturing the light emitting device according to the first embodiment of the present invention, in which FIG. 5A shows that the singulated light emitting elements with supporting bodies are arranged on a sheet, FIG. 5B shows that a phosphor layer is formed by spray coating, and FIG. 5C shows that the light emitting element is picked up.

FIGS. 6A and 6B are schematic cross-sectional views each showing the phosphor layer formed by using spray coating in a method of manufacturing a light emitting element according to the first embodiment of the present invention, in which FIG. 6A shows a case where the supporting body is provided, and FIG. 6B shows a case where the supporting body is not provided as a comparison example.

FIGS. 8A and 8B are schematic cross-sectional views each showing a configuration of a light emitting device according to a variation of the first embodiment of the present invention, in which FIG. 8A shows a case where a face-up mounting type light emitting element is used, and FIG. 8B shows a case where a vertical mounting type light emitting element is used.

FIGS. 11A and 11B are schematic cross-sectional views each showing a part of manufacturing steps in a method of manufacturing the light emitting device according to the third embodiment of the present invention, in which FIG. 11A shows that light emitting elements are formed, and FIG. 11B shows that a resin layer is formed.

DETAILED DESCRIPTION OF EMBODIMENTS

Hereinafter, a description will be given to embodiments of a light emitting device and a method of manufacturing the light emitting device according to the present invention. The drawings referenced in the following description schematically show the present invention, and dimensions, distances, and positional relationship of members may be exaggerated, or some members may be omitted in some cases. The scale and the distance of the members in a plan view may not always coincide with those in a cross-sectional view. Also, in the following description, the same name and reference mark show the same or similar member in general, and its detailed description is occasionally omitted.

First Embodiment

Configuration of Light Emitting Device

Figure 1A:
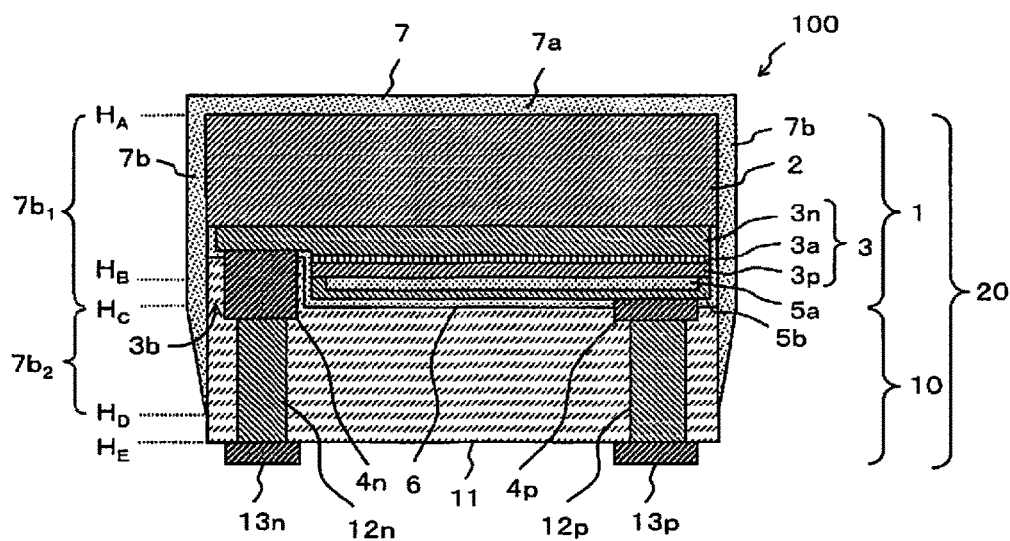

First, a configuration of a light emitting device according to a first embodiment of the present invention will be described with reference to FIG. 1A. As shown in FIG. 1A, a light emitting device 100 according to the present embodiment includes a supporting body 10, a semiconductor light emitting element 1 (hereinafter may be referred to as "light emitting element") provided on the supporting body 10, and a phosphor layer (wavelength conversion layer) 7 which covers an upper surface and side surfaces of the light emitting element 1, and upper side-surface portions of the supporting body 10. In the light emitting device 100, light (such as blue light) emitted from the light emitting element 1 is mixed with light (such as yellow light) provided in such a manner that the phosphor layer 7 partially absorbs the light emitted from the light emitting element 1 and converts its wavelength, and the mixed light (such as white light) is emitted from the upper surface and the side surfaces of the light emitting device.

The light emitting element 1 is an LED including a growth substrate 2, a semiconductor stacked layer body 3, an n-side electrode 4n, a p-side electrode 4p, an overall electrode 5a, a cover electrode 5b, and a protective layer 6. The light emitting element 1 according to the present embodiment is a face-down mounting type light emitting element in which one surface of the light emitting element 1 serves as a mounting surface on which the semiconductor stacked layer body 3, the n-side electrode 4n, and the p-side electrode 4p are provided, and the other surface of the light emitting element 1 serves as a light extracting surface on which the phosphor layer 7 is provided on the growth substrate 2.

The supporting body 10 serves as a raising member so that after disposing the light emitting element 1 and at the time of applying a spray coating on the upper surface and the side surfaces of the light emitting element 1 to form the phosphor layer 7, the light emitting element 1 can be positioned above the placement surface of coating object in a spray device to be used. A method of forming the phosphor layer 7 by spray coating will be described in detail below. The light emitting device 100 of the present embodiment is mounted on a mounting substrate (for example, a mounting substrate 9 in FIGS. 2A and 2B) in a state that the supporting body 10 is loaded with the face-down mounting type light emitting element 1. For this configuration, the supporting body 10 is provided with a resin layer 11, conductive members 12n and 12p, and pad electrodes 13n and 13p.

Next, components of the light emitting device 100 will be described in detail. The light emitting element 1 includes the semiconductor stacked layer body 3 having an n-type semiconductor layer 3n and a p-type semiconductor layer 3p on a lower surface of the growth substrate 2. The semiconductor stacked layer body 3 emits light when a current is applied thereto, and a light emitting layer 3a is preferably provided between the n-type semiconductor layer 3n and the p-type semiconductor layer 3p.

The semiconductor stacked layer body 3 has a region in which the p-type semiconductor layer 3p and the light emitting layer 3a do not exist, that is, a region recessed from the surface of the p-type semiconductor layer 3p (this region is referred to as a "step portion 3b") is formed. A bottom surface (lower surface in FIG. 1A) of the step portion 3b is an exposed surface of the n-type semiconductor layer 3n, and the n-side electrode 4n is formed in the step portion 3b. In addition, an almost entire upper surface of the p-type semiconductor layer 3p is covered with the overall electrode 5a having favorable reflectivity and the cover electrode 5b for covering the overall electrode 5a. The p-side electrode 4p is formed on a part of a lower surface of the cover electrode 5b. Surfaces of the semiconductor stacked layer body 3 and the cover electrode 5b are covered with the protective layer 6 having insulating and light transmissive properties, except for the regions of the n-side electrode 4n and the p-side electrode 4p which serve as the pad electrodes of the light emitting element 1.

The growth substrate 2 is provided for epitaxially growing the semiconductor stacked layer body 3. The growth substrate 2 has to be formed of a substrate material which allows of epitaxially growing the semiconductor stacked layer body 3, and the size, thickness, and the like of the growth substrate 2 are not limited in particular. In a case where the semiconductor stacked layer body 3 is composed of a nitride semiconductor such as GaN (gallium nitride), examples of the substrate material include insulating substrates such as sapphire having a principle plane of C-plane, R-plane, or A-plane, and spinel ($MgAl_2O_4$); and silicon carbide (SiC), ZnS, ZnO, Si, GaAs, diamond, and oxide substrates such as lithium niobate and neodymium gallate which form a lattice junction with a nitride semiconductor.

As described above, the semiconductor stacked layer body 3 has the n-type semiconductor layer 3n and the p-type semiconductor layer 3p and includes the light emitting layer 3a. According to the present embodiment, the step portion 3b is formed in such a manner that from one part of the surface of the semiconductor stacked layer body 3, the p-type semiconductor layer 3p and the light emitting layer 3a are entirely removed and the n-type semiconductor layer 3n is partially removed. Then, the n-side electrode 4n is formed on the bottom surface (lower surface) of the step portion 3b so as to be electrically connected to the n-type semiconductor layer 3n. Furthermore, a lower surface of the p-type semiconductor layer 3p which is a lower surface of the semiconductor stacked layer body 3 except for the step portion 3b is provided with stacked electrodes composed of the overall electrode 5a electrically connected to almost the entire surface of the p-type semiconductor layer 3p, the cover electrode 5b which covers a lower surface and side surfaces of the overall electrode 5a, and the p-side electrode 4p provided in a part of the lower surface of the cover electrode 5b.

The semiconductor stacked layer body 3 may be made of materials suitable for the semiconductor light emitting element, such as GaN, GaAs, InGaN, AlInGaP, GaP, SiC, and ZnO. According to the present embodiment, since the light emitted from the light emitting element 1 is partially converted to light of a different wavelength by the phosphor layer 7, the semiconductor stacked layer body 3 preferably emits blue light or purple light having a short emission wavelength.

The n-type semiconductor layer 3n, the light emitting layer 3a, and the p-type semiconductor layer 3p may be preferably made of a GaN-based compound semiconductor such as $In_XAl_YGa_{1-X-Y}N$ ($0 \leq X$, $0 \leq Y$, $X+Y \leq 1$). Each of the above semiconductor layers may have a single-layer structure, a laminated structure composed of layers each having a different composition and a different thickness, or a superlattice structure. Especially, the light emitting layer 3a preferably has a single quantum well or multiple quantum well structure in which thin films each having a quantum effect are stacked.

In the case where the semiconductor stacked layer body 3 is made of the GaN-based compound semiconductor, the semiconductor stacked layer body 3 can be formed by a known technique such as MOCVD (metalorganic chemical vapor deposition) method, HVPE (hydride vapor phase epitaxy) method, or MBE (molecular beam epitaxy) method. Furthermore, a thickness of the semiconductor layer is not limited in particular, and various thicknesses may be applied.

The overall electrode 5a is provided so as to cover almost the entire lower surface of the p-type semiconductor layer 3p. The cover electrode 5b is provided so as to cover the entire lower surface and the entire side surfaces of the overall electrode 5a. The overall electrode 5a serves as a conductor layer for uniformly diffusing a current supplied from the cover electrode 5b and the p-side electrode 4p provided on the part of the lower surface of the cover electrode 5b, to the entire surface of the p-type semiconductor layer 3p. In addition, the overall electrode 5a also functions as a reflective film which has favorable reflectivity to reflect the light emitted from the light emitting element 1 upward, that is, toward the light extracting surface. Here, the term "favorable reflectivity" means that the light emitted from the light emitting element 1 can be preferably reflected. Furthermore, it is preferable that the overall electrode 5a has the favorable reflectivity also for the light of the wavelength converted by the phosphor layer 7.

The overall electrode 5a may be made of a metal material having preferable conductivity and reflectivity. For the metal material having the favorable reflectivity in a visible light region, Ag, Al, or an alloy containing the above metal as a main component may be preferably used. In addition, the overall electrode 5a may be composed of a single layer or stacked layers of the above metal materials.

Furthermore, the cover electrode 5b serves as a barrier layer for preventing migration of the metal material constituting the overall electrode 5a. Particularly, in the case where the overall electrode 5a is made of Ag in which migration can easily occur, the cover electrode 5b is preferably provided. The cover electrode 5b may be made of a metal material having favorable conductivity and barrier properties, such as Al, Ti, W, or Au. In addition, the cover electrode 5b may be composed of a single layer or stacked layers of the above metal materials.

The n-side electrode 4n is provided on the bottom surface, where the n-type semiconductor layer 3n is exposed, of the step portion 3b of the semiconductor stacked layer body 3. In addition, the p-side electrode 4p is provided on a part of the lower surface of the cover electrode 5b. The n-side electrode 4n is electrically connected to the n-type semiconductor layer 3n, and the p-side electrode 4p is electrically connected to the p-type semiconductor layer 3p through the cover electrode 5b and the overall electrode 5a. The n-side electrode 4n and the p-side electrode 4p serve as the pad electrodes for supplying external current to the light emitting element 1.

For the n-side electrode 4n and the p-side electrode 4p, a metal material can be used. For example, a single metal such as Ag, Al, Ni, Rh, Au, Cu, Ti, Pt, Pd, Mo, Cr, or W, or an alloy or the like of those metals can be preferably used. In addition, each of the n-side electrode 4n and the p-side electrode 4p may be composed of a single layer or stacked layers of the above metal materials.

The protective layer 6 has insulating and light transmissive properties and covers the entire surface of the light emitting element 1 except for the growth substrate 2, and the portions of the n-side electrode 4n and the p-side electrode 4p which to be connected to the outside. The protective layer 6 serves as a protective film and an antistatic film of the light emitting element 1. In addition, since the protective layer 6 covers the side surfaces of the semiconductor stacked layer body 3 from which the light is extracted, the protective layer 6 preferably has favorable light transmissive properties to the light of the wavelength emitted from the light emitting element 1. Furthermore, it is preferable that the protective layer 6 has favorable light transmissive properties also to the light of the wavelength converted by the phosphor layer 7.

The protective layer 6 may be made of a metal oxide or metal nitride, such as an oxide or nitride of at least one element selected from the group consisting of Si, Ti, Zr, Nb, Ta, and Al.

The phosphor layer (wavelength conversion layer) 7 is composed of a resin containing a granular phosphor (wavelength conversion member), and serves as a wavelength conversion layer which partially or entirely absorbs the light emitted from the light emitting element 1, and emits light having a wavelength different from the wavelength of the light emitted from the light emitting element 1. In the example shown in FIG. 1A, with the light emitting device 100 mounted in a face-down manner, the phosphor layer 7 is provided so as to cover the entire upper surface of the light emitting element 1 (that is, the upper surface of the growth substrate 2), the entire side surfaces of the light emitting element 1 (that is, the side surfaces of the growth substrate 2 and the side surfaces of the semiconductor stacked layer body 3 covered with the protective layer 6), and the upper side-surface portions of the supporting body 10. Marks HA to HE shown in FIG. 1A represent positions (heights) of the light emitting device 100 in the thickness direction. Marks HA to HE in FIGS. 1B, 6A, and 8A to 10B also represent positions in the thickness direction.

An upper surface portion 7a of the phosphor layer 7 provided on the upper surface of the light emitting element 1 is formed with almost a uniform thickness. Of each side surface portion 7b of the phosphor layer 7 provided on the side surfaces of the light emitting element 1 and the side surfaces of the supporting body 10, an upper side-surface portion 7b1 continuously provided from the position HA at an upper end of the light emitting element 1 to the position HC at the middle of the supporting body 10 is formed so as to have the almost a uniform thickness. The thickness of the upper side-surface portion 7b1 is preferably approximate to the thickness of the upper surface portion 7a, but the thickness of the upper side-surface portion 7b1 may be smaller than that of the upper surface portion 7a. For example, in a case where the thickness of the upper surface portion 7a is 60 µm, the thickness of the upper side-surface portion 7b1 may be 10 µm to 40 µm.

Whereas, a lower side-surface portion 7b2 provided from the position HC described above to the position HD at a middle of the supporting body 10, the thickness is gradually reduced from the position HC at the upper end of the lower side-surface portion 7b2 toward the position HD at the lower end of the lower side-surface portion 7b2. Here, on each side surface of the light emitting element 1, the upper side-surface portion 7b1 having an almost uniform thickness is preferably formed at least on the portions for emitting light, that is, the side surface of the growth substrate 2 and the side surface of the semiconductor stacked layer body 3.

In an example shown in FIG. 1A, the upper side-surface portion 7b1 is preferably provided on each side surface of the light emitting element 1, extending from the position HA at the upper end of the light emitting element 1 to the HB at a lower end of the semiconductor stacked layer body 3, that is, a lower end of a light emission surface. In addition, in order to prevent emission color of the phosphor occurring from unnecessarily wide range of the lower side-surface portion 7b2 of the phosphor layer 7 of the light emitting device 100, the position HC at the lower end of the upper side-surface portion 7b1 is preferably close to the position HB. With this arrangement, the chromaticity distribution of the mixed light emitted from the side surface portions 7b provided on the side surfaces of the light emitting device 100 can be made substantially uniform.

In addition, the position HD at the lower end of each lower side-surface portion 7b2 is preferably either substantially the same as or higher than the position HE at a lower end of the resin layer 11 of the supporting body 10. With this arrangement, emission from a lower portion of the light emitting device 100 which is due to light propagating through the phosphor layer 7 and reaching the end portions of the light emitting device 100 can be reduced. In addition, preferably, the lower side-surface portion 7b2 is formed into a tapered shape in which the thickness is gradually reduced downwardly, and more preferably, the tapered shape is provided such that the lower end position HD has a thickness of "0". Thus, due to the tapered shape, even when another member or a jig touches an edge portion of the phosphor layer 7 while the light emitting device 100 is handled in a manufacturing process, the phosphor layer 7 can be formed so as not likely to be removed from the supporting body 10 and the light emitting element 1. Furthermore, in addition to arrange the position HD at the lower end of the lower side-surface portion 7b2 higher than the position HE, the lower side-surface portion 7b2 is formed thinner than the upper side-surface portion 7b1. Thus, it becomes possible to prevent the light having the emission color of the phosphor from being intensely emitted, from the lower side-surface portion 7b2 due to the excess phosphor layer 7.

The thickness of each of the upper surface portion 7a and the upper side-surface portion 7b1 of the phosphor layer 7 can be determined by a content of the phosphor, a desired color tone of the mixed color of the light emitted from the light emitting element 1 and the light having the converted wavelength, and the like. For example, the thickness of each of the upper surface portion 7a and upper side-surface portion 7b1 of the phosphor layer 7 may be 1 µm to 500 µm, preferably 5 µm to 200 µm, and more preferably 10 µm to 100 µm.

The content of the phosphor in the phosphor layer 7 is preferably adjusted to 0.1 mg/cm² to 50 mg/cm² in mass per unit area. With the content of the phosphor within this range, the color conversion can be sufficiently implemented.

A resin material preferably has favorable light transmissive properties for the light emitted from the light emitting element 1 and the light of the wavelength converted by a phosphor in the phosphor layer 7. Furthermore, according to the present embodiment, the resin material is preferably a thermosetting resin so that the phosphor layer 7 can be formed in such a manner that a slurry is prepared by mixing a solvent, the resin, and the granular phosphor and the prepared slurry is applied with spray, then the applied resin is cured by heating to obtain the phosphor layer 7.

Examples of such a resin material include a silicone resin, a modified silicone resin, an epoxy resin, a modified epoxy resin, a urea resin, a phenol resin, an acrylate resin, a urethane resin, a fluorine resin, a resin containing at least one kind of those resins, or a hybrid resin, and which can be preferably used.

The phosphor (wavelength conversion member) is not limited in particular as long as it can be excited by light of the wavelength emitted from the light emitting element 1 and emits fluorescent light of the wavelength different from that of the exciting light, and the granular phosphor is preferably used. Since the granular phosphor has light diffusing and light reflecting properties, the phosphor can also function as a light diffusion member in addition to the wavelength converting member, so that the phosphor has an effect of diffusing the light. It is preferable that the phosphor is roughly uniformly mixed in the phosphor layer 7 serving as the resin layer. In addition, as for the phosphor in the phosphor layer 7, two or more kinds may be uniformly mixed, or may be distributed so as to have a multilayer structure. Furthermore, the phosphor preferably has an average diameter of 2.5 µm to 30 µm measured by Fisher Sub Sieve Sizer (F. S. S. S.) method so that the slurry containing the solvent and the thermosetting resin with the phosphor can be sprayed.

As the phosphor material, a known material in the art may be used. Examples of the phosphor material include a YAG (yttrium aluminum garnet)-based phosphor activated by Ce (cerium), a LAG (lutetium aluminum garnet)-based phosphor activated by Ce, a nitrogen-containing calcium aluminosilicate ($CaO—Al_2O_3—SiO_2$)-based phosphor activated by Eu (europium) and/or Cr (chromium), a silicate (($Sr, Ba)_2SiO_4$)-based phosphor activated by Eu, a β sialon phosphor, and a KSF ($K_2SiF_6$: Mn)-based phosphor. In addition, a quantum dot phosphor may be also used. In addition, an LED having high efficiency can be obtained by combining a blue-light emitting element and a yellow-light emitting phosphor, and combining a blue-green-light emitting element and a red-light emitting phosphor. An LED having high color reproducibility can be obtained by combining the blue-light emitting element, a green-light emitting phosphor, and the red-light emitting phosphor. An LED having high color rendering properties can be obtained by combining the blue-light emitting element, the yellow-light emitting phosphor, and the red-light emitting phosphor.

In addition, a binding material to bind a phosphor to a phosphor is preferably added to the above phosphor material. As the binding material, for example, light transmissive inorganic materials such as $SiO_2$, $Al_2O_3$, and MSiO (M is Zn, Ca, Mg, Ba, Sr, Zr, or Y) may be used.

Furthermore, in order to adjust viscosity at the time of spraying or to give the light diffusing properties to the phosphor layer 7, an inorganic filler may be added. The inorganic filler may be composed of light transmissive inorganic compound particles of oxide, carbonate, sulfate, or nitride of elements such as Si, Al, Zn, Ca, Mg, or rare earth element such as Y, or Zr or Ti, or composite salt such as bentonite or potassium titanate. The average particle diameter of the inorganic filler may be in a similar range as the above range of the average particle diameter of the phosphor.

In addition, an inorganic material ratio which is a total content ratio of the phosphor particles and the inorganic filler particles in the phosphor layer 7 formed of the resin is defined by the following equation.

Inorganic material ratio=(phosphor mass+inorganic filler mass)/(phosphor mass+inorganic filler mass+resin mass)

This inorganic material ratio is not specifically limited, but when the inorganic material ratio is set to be preferably 30% by mass or more, more preferably 50% by mass or more, and still more preferably 60% by mass or more, enough amounts of the phosphor and/or the inorganic filler can be provided to convert the wavelength and/or to diffuse the light. In addition, when the inorganic material ratio is set to be preferably 99% by mass or less, more preferably 90% by mass or less, and sill more preferably 85% by mass or less, the resin contained in the phosphor layer 7 can bond the inorganic materials to each other, and bond the inorganic material to the light emitting element 20 with the supporting body, with enough strength.

As described above, the supporting body 10 is provided under the light emitting element 1 to increase the height of the light emitting element 1 when the phosphor layer 7 is sprayed by the spray device to the upper surface and the side surfaces of the light emitting element 1. The supporting body 10 in the present embodiment includes the resin layer 11, the conductive members 12n and 12p, and the pad electrodes 13n and 13p. The face-down mounting type light emitting element 1 is provided in such a manner that the surface having the semiconductor stacked layer body 3, the n-side electrode 4n, and the p-side electrode 4p is opposed to the upper surface of the supporting body 10 so that the n-side electrode 4n is electrically connected to the conductive member 12n, and the p-side electrode 4p is electrically connected to the conductive member 12. The supporting body 10 in the present embodiment is formed into substantially the same shape of the light emitting element 1 in a plan view.

An outline shape of the supporting body 10 is preferably the same as an outline shape of the light emitting element 1, or smaller than the outline shape of the light emitting element 1 so as to be positioned at an inner side in the plan view. It is especially preferable that the whole of the supporting body 10 is positioned inside the outline of the light emitting element 1 in the plan view. In addition, a thickness of the supporting body 10 is preferably equal to or larger than a thickness of the phosphor layer 7, and the thickness of the supporting body 10 can be 20 µm to 200 µm, and preferably 50 µm to 100 µm. Since the supporting body 10 has the above shape, when the phosphor layer 7 is formed by spray coating, the side surface portion 7b of the phosphor layer 7 formed on the side surface of the supporting body 10 can become short and/or thin downwardly.

The resin layer 11 serves as a body of the supporting body 10 to increase the height of the light emitting element 1. The conductive members 12n and 12p are provided in the resin layer 11 so as to penetrate the resin layer 11 in a thickness direction. The resin layer 11 in the present embodiment may be formed of an insulating resin, for example, thermosetting resins such as a phenol resin composition, a thermosetting polyimide resin composition, a urea resin composition, a silicone resin composition, an epoxy resin composition, or a hybrid resin of these can be preferably used. More favorable examples of the insulating resin can include a resist resin composition which is used in photolithography and contains a silicone resin or epoxy resin superior in heat resistance and light resistance as a base resin, and a molding resin composition used in various kinds of molding processes. An inorganic filler may be added to the above resin composition to increase reflectivity and mechanical strength or to reduce a linear expansion coefficient. The linear expansion coefficient of the resin composition is preferably 30 ppm or less. In the present embodiment, the resin layer 11 is used as the body of the supporting body 10, but glass or other inorganic materials may be used instead of the resin material.

The resin layer 11 preferably has favorable light reflectivity for the light of the wavelength emitted from the light emitting element 1. In this case, a light reflective inorganic filler is added to the resin layer 11. In addition, the resin material for the resin layer 11 preferably has favorable translucency for the light of the wavelength emitted from the light emitting element 1. Thus, the resin layer 11 functions as a reflecting film, so that the resin layer 11 can reflect the light which has been leaked from the lower surface of the light emitting element 1, and return the light to the light emitting element 1. As a result, efficiency of light extraction from the light extracting surface can be improved. The inorganic filler may be the same as the light diffusing inorganic filler to be contained in the phosphor layer 7.

Figure 2A:
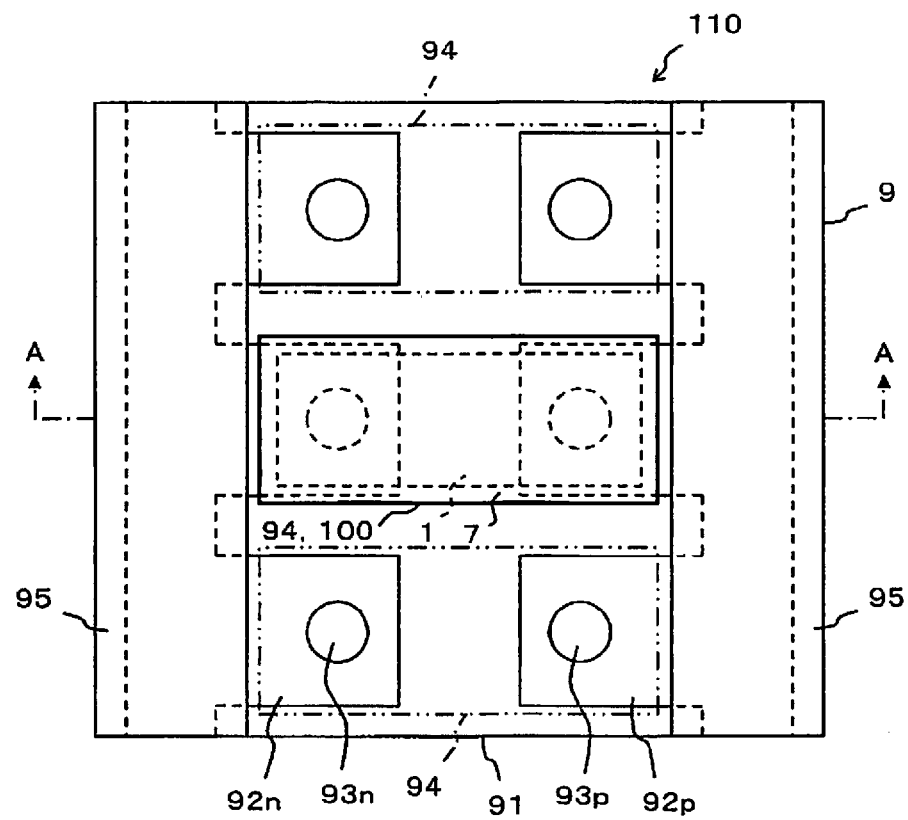
Figure 2B:
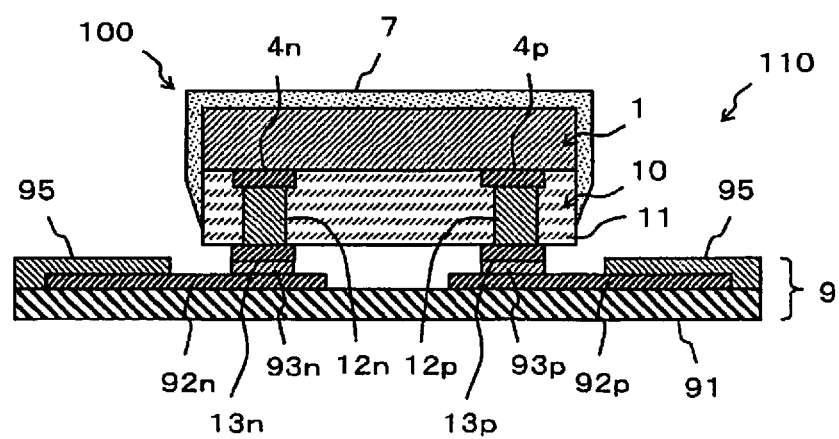

The conductive member 12n is provided so as to penetrate the resin layer 11 in the thickness direction so that its upper end is electrically connected to the n-side electrode 4n, and its lower end is electrically connected to the pad electrode 13n to be connected to a mounting substrate (refer to the mounting substrate 9 in FIGS. 2A and 2B, for example). In addition, the conductive member 12p is provided so as to penetrate the resin layer 11 in the thickness direction so that its upper end is electrically connected to the p-side electrode 4p, and its lower end is electrically connected to the pad electrode 13p to be connected to the mounting substrate. Each of the conductive members 12n and 12p is preferably made of metal having high electric conductivity such as Au, Cu, Ag, or Al, or an alloy mainly composed of the above metals.

The pad electrodes 13n and 13p are to be electrically connected to the electrodes of the mounting substrate when the light emitting device 100 is mounted on the mounting substrate. The pad electrode 13n is electrically connected to the lower end of the conductive member 12n, and the pad electrode 13p is electrically connected to the lower end of the conductive member 12p. The pad electrodes 13n and 13p serve as a negative electrode and a positive electrode of the light emitting device 100, respectively. Each of the pad electrodes 13n and 13p is preferably made of Au, or an alloy mainly composed of Au which is high in electric conductivity and superior in corrosion resistance.

In the present embodiment, the pad electrodes 13n and 13p are formed to be wider than the conductive members 12n and 12p in the plan view, respectively, but the pad electrodes 13n and 13p may be formed to be the same or narrower. In addition, according to the present embodiment, lower surfaces of the pad electrodes 13n and 13p project downward from a lower surface of the resin layer 11, but instead of this, the pad electrodes 13n and 13p may be formed so as to be buried in the resin layer 11. In addition, the conductive members 12n and 12p may be used as the pad electrodes without providing the pad electrodes 13n and 13p.

<Variation of Light Emitting Device>

Next, a light emitting device according to a variation of the first embodiment of the present invention will be described with reference to FIG. 1B. A light emitting device 100A according to the variation of the first embodiment shown in FIG. 1B differs from the light emitting device 100 shown in FIG. 1A in that a light emitting element 1A not having the growth substrate 2 is provided instead of the light emitting element 1. The other configuration of the light emitting device 100A is the same as that of the light emitting device 100, so that the same component is marked with the same reference and a detailed description is omitted.

In the light emitting device 100A in this variation, similar to the light emitting device 100, the light emitting element 1A is provided such that a surface having the n-side electrode 4n and the p-side electrode 4p is opposed to the supporting body 10. The upper side-surface portion 7b1 of the phosphor layer 7 is provided such that the position HC at the lower end of the upper side-surface portion 7b1 is the same as the position HB, that is, the lower end of the semiconductor stacked layer body 3, or lower than the position HB at the lower end of the light emission surface in the side surface of the light emitting element 1A. The lower side-surface portion 7b2 of the phosphor layer 7 is provided such that the lower side-surface portion 7b2 becomes thinner downwardly, and the position HD at the lower end of the lower side-surface portion 7b2 is the same as the position HE or higher than the position HE at the lower end of the resin layer 11 of the supporting body 10.

<Light Emitting Device with Mounting Substrate>

Next, a description will be given to a light emitting device with the mounting substrate provided after the above light emitting devices 100 have been mounted on the mounting substrate, with reference to FIGS. 2A and 2B. As shown in FIGS. 2A and 2B, a light emitting device 110 with the mounting substrate is provided after the plurality of the light emitting devices 100 have been mounted on the mounting substrate 9. The number of the light emitting devices 100 to be mounted on the mounting substrate 9 is not specifically limited, and at least one of the light emitting devices may be mounted. The light emitting device to be mounted is not limited to the light emitting device 100 shown in FIG. 1A, and the light emitting device 100A shown in FIG. 1B may be mounted instead of the light emitting device 100.

The example shown in FIG. 2A schematically and selectively shows a region in which the three light emitting devices 100 are to be mounted. In addition, the example shows a case where the light emitting device 100 is mounted in one mounting region 94 provided in a center among the three mounting regions 94.

As shown in FIG. 2A, the mounting substrate 9 is provided in such a manner that a negative side wiring electrode 92n and a positive side wiring electrode 92p each having a comb-like shape are provided on an insulating supporting substrate 91 so that their tooth portions in the comb-like shapes are opposed to each other in a plan view. The mounting region 94 for mounting the one light emitting device 100 includes one pair of tooth portions in the comblike shapes of the negative side wiring electrode 92n and the positive side wiring electrode 92p.

A negative electrode connection layer 93n and a positive electrode connection layer 93p are provided in the mounting region 94 as solder layers to be connected to the n-side electrode 4n and the p-side electrode 4p of the light emitting device 100, respectively. The negative electrode connection layer 93n and the positive electrode connection layer 93p are melted by a reflow technique, and connect the n-side electrode 4n to the negative side wiring electrode 92n, and the p-side electrode 4p to the positive side wiring electrode 92p, respectively. In addition, each of the negative side wiring electrode 92n and positive side wiring electrode 92p is connected to a feeding terminal, and supplied with a power from an external power supply through the feeding terminal.

In addition, right and left upper surface regions of the mounting substrate 9 except for the mounting region 94 are each covered with an insulating reflecting layer 95. According to the example shown in FIGS. 2A and 2B, the reflecting layer 95 only covers the right and left sides of the mounting region 94, but the reflecting layer 95 may further cover a region except for the regions of the negative electrode connection layer 93n and the positive electrode connection layer 93p.

The reflecting layer 95 has favorable reflectivity for the light of the wavelength emitted from the light emitting element 1 and the light of the wavelength emitted from the phosphor layer 7. The reflecting layer 95 may be made of the same material as that of the above reflecting resin layer 11. That is, the reflecting layer 95 can be formed by applying the resin containing the light reflective inorganic filler.

In the light emitting device 110 with the mounting substrate in the present invention, the light emitting devices 100 may be sealed with a light transmissive sealing member as a whole. The sealing member may be made of the resin material used for the phosphor layer 7 and the reflecting layer 95, or an inorganic material such as glass or silica gel. Furthermore, a light diffusion member may be added to the sealing member. With this configuration, the light emitted from the light emitting element 1 can be favorably mixed with the light emitted from the phosphor layer 7.
As the light diffusion member, the same member as that shown as the light reflecting member of the reflecting layer 95 may be used.

Furthermore, the light emitting device 100 according to the present embodiment, is not only limited to that employing a combination of blue light and yellow light, but also to employ a combination of light emitted from a light emitting element and light which is created by a phosphor layer 7 absorbing a portion of light emitted from the light emitting element and converting into light of a different wavelength. For example, the light emitting element 1 may emit blue light, and the phosphor layer 7 may convert the blue light to red light and/or green light, or the light emitting element 1 may emit ultraviolet light, and the phosphor layer 7 may convert the ultraviolet light to light of a longer wavelength such as blue light, green light, yellow light, or red light.

Operation of Light Emitting Device

Next, an operation of the light emitting device 110 with the mounting substrate will be described with reference to FIGS. 2A and 2B (refer to FIG. 1A occasionally). The description will be given assuming that the light emitting element 1 emits blue light, and the phosphor layer 7 emits yellow light, for convenience of the description.

In the light emitting device 110 with the mounting substrate shown in FIGS. 2A and 2B, when the external power supply is connected to the feeding terminals provided in the mounting substrate 9, a current is supplied between the p-side electrode 4p and the n-side electrode 4n of the light emitting element 1 through the positive side wiring electrode 92p and the negative side wiring electrode 92n, the connection layer for positive electrode 93p and the connection layer for negative electrode 93n, and through the pad electrode 13p, the pad electrode 13n, the conductive member 12p, and the conductive member 12n of the light emitting device 100. Thus, when the current is supplied between the p-side electrode 4p and the n-side electrode 4n, the light emitting layer 3a of the light emitting element 1 emits blue light.

The blue light emitted from the light emitting layer 3a of the light emitting element 1 transmits in the semiconductor stacked layer body 3 and the growth substrate 2. This light is outputted from the upper surface or the side surface of the light emitting element 1, and partially absorbed by the phosphor particles in the phosphor layer 7, converted to yellow light, and externally extracted. In addition, the blue light partially passes through the phosphor layer 7 without being absorbed by the phosphor, and externally extracted. The light transmitted downward in the light emitting element 1 is reflected upward by the overall electrode 5a, and outputted from the upper surface or the side surface of the light emitting element 1. Thus, the yellow light and the blue light are externally extracted from the light emitting device 100 and mixed with each other, and then white light is generated. The light extracted from the side surface of the light emitting device 100 in a downward direction is reflected upward by the reflecting layer 95 and outputted from the light emitting device 110. The light emitting device 100A is the same as the light emitting device 100 in the configuration except that the blue light emitted from the upper surface of the semiconductor stacked layer body 3 is directly inputted to the phosphor layer 7. Thus, the description is omitted.

Method of Manufacturing Light Emitting Device

Figure 3:
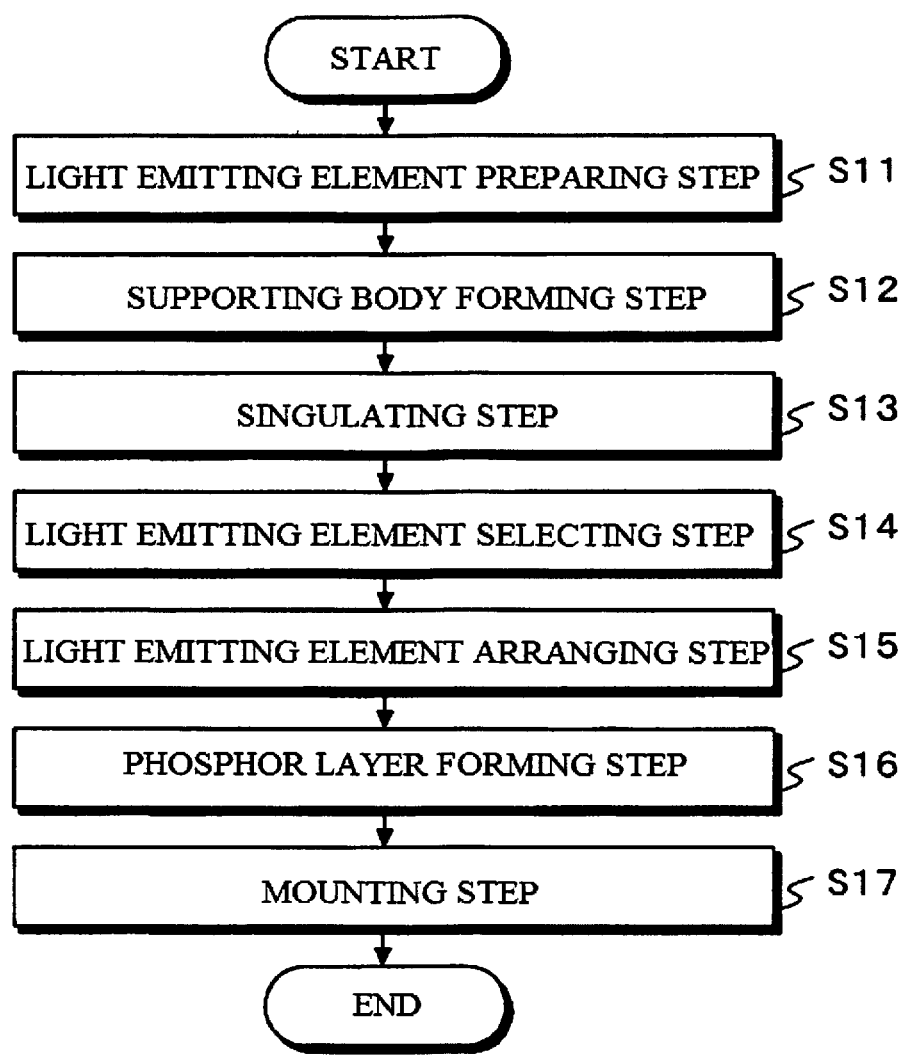
FIG. 3 is a flowchart showing a flow of a method of manufacturing a light emitting device according to the first embodiment of the present invention.

Next, a method of manufacturing the light emitting device 110 shown in FIGS. 2A and 2B will be described with reference to FIG. 3. As shown in FIG. 3, the method of manufacturing the light emitting device 110 includes a light emitting element preparing step S11, a supporting body forming step S12, a singulating step S13, a light emitting element selecting step S14, a light emitting element arranging step S15, a phosphor layer forming step (wavelength conversion layer forming step) S16, and a mounting step S17, and those steps are executed in this order. Hereinafter, each step will be described in detail with reference to FIGS. 4A to 5C (refer to FIGS. 1A to 3, occasionally). In each of the FIGS. 4A to 5C, some detailed components (such as the protective layer 6, and the laminated structure of the semiconductor stacked layer body 3) in the light emitting element 1 are omitted for ease of illustration.

The light emitting element preparing step S11 is performed to prepare the light emitting element 1 having the configuration shown in FIG. 1A. According to the light emitting element preparing step S11 in the present embodiment, a wafer is formed such that the plurality of the light emitting elements 1 are arranged on the one growth substrate 2.

Figure 1B:
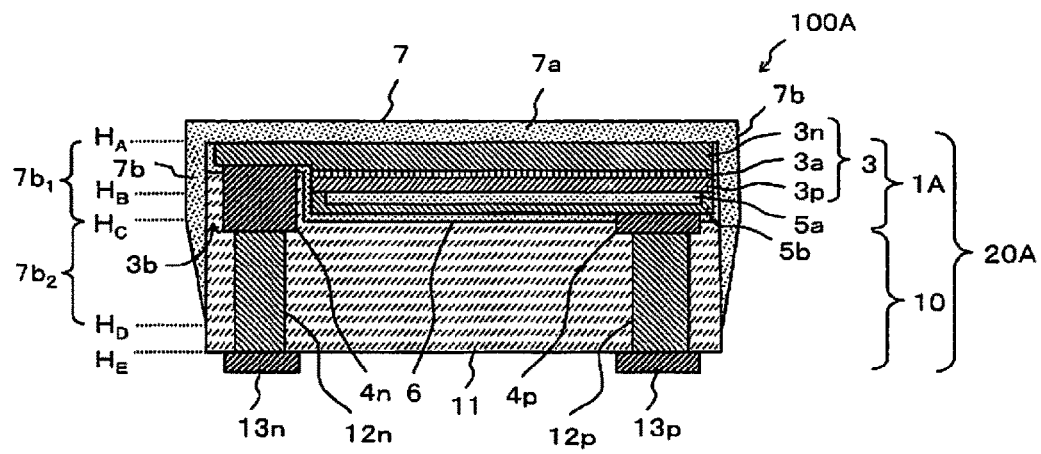
Figure 4A:
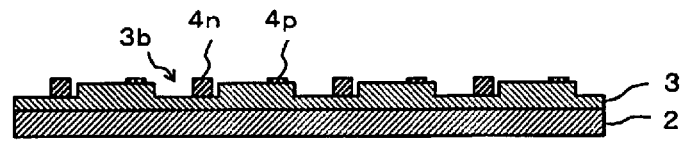

More specifically, the semiconductor stacked layer body 3 is formed of the above-described semiconductor material by sequentially laminating the n-type semiconductor layer 3n, the light emitting layer 3a, and the p-type semiconductor layer 3p, on the lower surface in FIGS. 1A and 1B) composed of sapphire or the like. After the semiconductor stacked layer body 3 has been formed, the step portion 3b in which the n-type semiconductor layer 3n is exposed in the bottom surface is formed by removing the p-type semiconductor layer 3p, the light emitting layer 3a, and one part of the n-type semiconductor layer 3n by etching from the one portion of the surface (on the lower surface in FIGS. 1A and 1B) of the semiconductor stacked layer body 3. Then, the n-side electrode 4n serving as the pad electrode is formed on the bottom surface of the step portion 3b. In addition, the region serving as the light emitting region having the p-type semiconductor layer 3p and the light emitting layer 3a is covered with the reflective overall electrode 5a formed to cover almost the entire lower surface of the p-type semiconductor layer 3p, the cover electrode 5b is formed to cover the surface of the overall electrode 5a, and the p-side electrode 4p serving as the pad electrode is formed in the one portion of the lower surface of the cover electrode 5b. Furthermore, the insulating SiO2 protective layer 6 is formed on the entire surface of a wafer except for the n-side electrode 4n and the p-side electrode 4p, by sputtering, for example. As a result, as shown in FIG. 4A, the light emitting elements 1 are formed on the wafer.

Subsequently, in the supporting body forming step S12, the supporting body 10 is formed on the wafer. This step is composed of three sub steps as shown in FIGS. 4B to 4D.

(Resin Layer Forming Step)

Figure 4B:
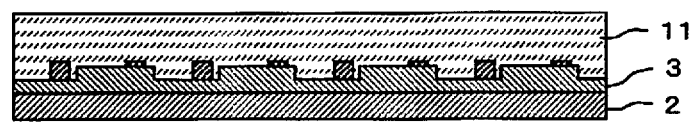
Figure 4C:
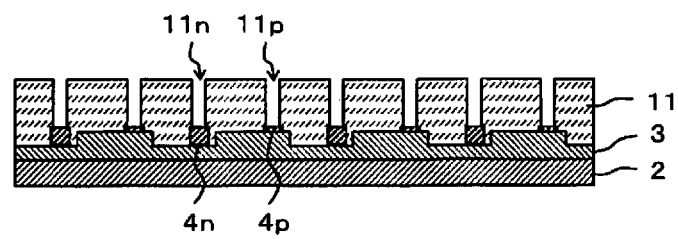
Figure 4D:
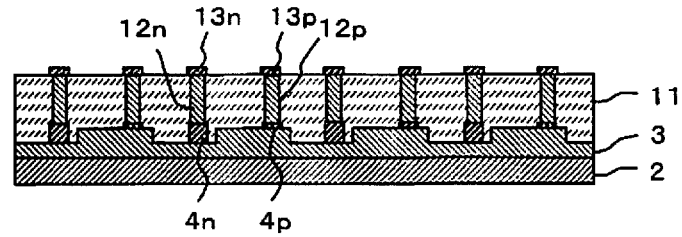

In a resin layer forming step serving as a first sub step, as shown in FIG. 4B, the resin layer 11 serving as a base of the supporting body 10 is formed on an entire surface of the wafer. The resin layer 11 can be formed by spray coating, spin coating, or casting. The resin layer 11 may be made of the above-described resin material such as polyimide. The resin material for the resin layer 11 is preferably a photosensitive resin such as photosensitive polyimide. With this, in a next second sub step, through holes 11n and 11p can be formed in the resin layer 11 by a photo process.

(Through Hole Forming Step)

In a through hole forming step serving as the second sub step, as shown in FIG. 4C, the through holes 11n and 11p are formed in the resin layer 11 which has been formed in the resin layer forming step. The through holes 11n and 11p are formed so as to expose the n-side electrode 4n and the p-side electrode 4p, respectively. As described above, the through holes 11n and 11p can be formed by the photo process when the resin layer 11 is made of the photosensitive resin. That is, with a mask having openings in regions just above the n-side electrode 4n and the p-side electrode 4p, the upper surface of the resin layer 11 is exposed to light from above, and then, unexposed portions are developed and removed, whereby the through holes 11n and 11p are formed. In addition, in a case where the resin layer 11 is negatively developed, the regions corresponding to the through holes 11n and 11p are to be exposed. In a case where the resin layer 11 is not a photosensitive layer, the through holes 11n and 11p can be formed by photolithography using a mask and etching.

(Conductive Member Forming Step)

In a conductive member forming step serving as a third sub step, as shown in FIG. 4D, conductive members 12n and 12p are formed in the through holes 11n and 11p which have been formed in the through hole forming step, and the pad electrodes 13n and 13p are formed on the upper surfaces of the conductive members 12n and 12p, respectively. The conductive members 12n and 12p and the pad electrodes 13n and 13p may be formed by electrolytic plating. In this case, first, a seed layer is formed of a metal material (such as Ni or Au) on an entire surface of the resin layer 11 including inner surfaces of the through holes 11n and 11p by sputtering. Then, the electrolytic plating is performed with the seed layer used as one electrode, so that metal (such as Cu) layers can be laminated on the surface of the resin layer 11 including the inner surfaces of the through holes 11n and 11p. Thus, the metal in the through holes 11n and 11p serve as the conductive members 12n and 12p.

Subsequently, the unnecessary metal layer laminated on the upper surface of the resin layer 11 is removed together with an upper portion of the resin layer 11 by cutting or polishing. Thus, the supporting body 10 is formed such that the upper surface of the resin layer 11 and the upper surfaces of the conductive members 12n and 12p are flush with one another. In the case where the pad electrodes 13n and 13p are formed, a resist mask having openings in regions corresponding to the pad electrodes 13n and 13p is subsequently formed on the upper surface of the supporting body 10, and then a metal layer is formed by sputtering or electrolytic plating. After that, the resist mask and the metal layer laminated on an upper surface thereof are removed, whereby the pad electrodes 13n and 13p are formed.

In a case where the pad electrode 13n and 13p are formed into the same shape as those of the conductive members 12n and 12p in the plan view, following the electrolytic plating for forming the conductive members 12n and 12p, a plating solution is exchanged, and the metal layer (such as Au) may be similarly formed so as to be laminated as the pad electrodes 13n and 13p. In the case where the pad electrodes 13n and 13p are continuously formed by the electrolytic plating after the conductive members 12n and 12p have been formed, a total thickness of the conductive member 12n or 12p and the pad electrode 13n or 13p is made to be smaller than a thickness of the resin layer 11. As described above, since the upper portion of the resin layer 11 is cut and removed so as to expose the pad electrodes 13n and 13p, the supporting body 10 is formed such that the upper surfaces of the pad electrodes 13n and 13p and the upper surface of the resin layer 11 are flush with one another.

In the above example, when the conductive members 12n and 12p are formed by electrolytic plating, the resist mask is used to determine the shapes of the conductive members 12n and 12p, and left and used as the resin layer 11, but the resin layer 11 may be formed of other resin materials. For example, after the conductive members 12n and 12p have been grown by a wet process such as electrolytic plating, or a dry process such as sputtering, the resist mask may be removed, and the resin layer 11 may be formed of an EMC (epoxy molding compound) or SMC (silicone molding compound). Thus, the resin having a required function can be selected.

Specifically, in the case where the conductive members 12n and 12p are formed by electrolytic plating, the resist mask is formed of an acrylic resin based resist material, and the resist mask is removed after the electrolytic plating. The resin layer 11 is formed of an epoxy resin composition containing a white filler such as titanium oxide by compression molding or transfer molding, so that the supporting body 10 can be a highly reflective body.

Figure 4E:
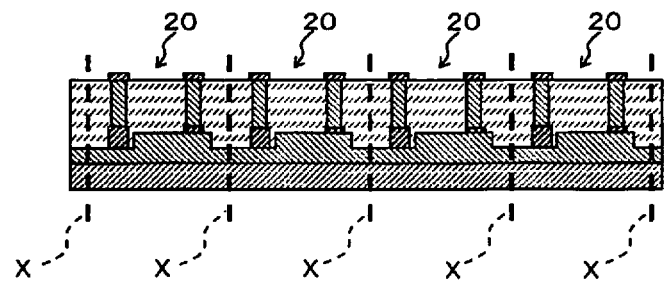

Subsequently, in the singulating step S13, the light emitting elements 1 formed on the supporting body 10, that is, the light emitting elements 20 with the supporting body are singulated along cut lines X shown by broken lines, as shown in FIG. 4E.

The light emitting elements 20 with the supporting body in the wafer state may be cut by dicing or scribing. Before the wafer is cut, a back surface of the growth substrate 2 may be polished and thinned, or a groove may be formed in a thickness direction of the resin layer 11 along the cut lines X. This groove can be formed in the same way as the through hole formed in the through hole forming step. Thus, the light emitting elements 20 with the supporting body in the wafer state can be easily cut.

In the case where the light emitting device 100A shown in FIG. 1B is used as the light emitting device, after the supporting body 10 has been formed, the growth substrate 2 is removed by a LLO (laser liftoff) process or chemical liftoff process, and then the singulating step S13 is performed. After the growth substrate 2 has been removed, the upper surface of the semiconductor stacked layer body 3 may be polished and then the upper surface of the semiconductor stacked layer body 3 may be roughened by wet etching to have an uneven surface. Thus, the light extracting efficiency from the light emitting device 100A can be improved.

Subsequently, in the light emitting element selecting step S14, the one having predetermined range of light emission characteristics is selected from the light emitting elements 20 with supporting bodies which have been singulated in the singulating step S13. Here, the predetermined range of light emission characteristics means a center wavelength and/or light emission intensity of the light emitted from the light emitting element 1. By selecting the light emitting element 20 with the supporting body having the similar light emission characteristics, the phosphor layer 7 can be formed with high uniformity in the phosphor layer forming step S16 which will be described below, and in addition, the color tone can be prevented from varying among the manufactured light emitting devices 100.

Figure 5A:
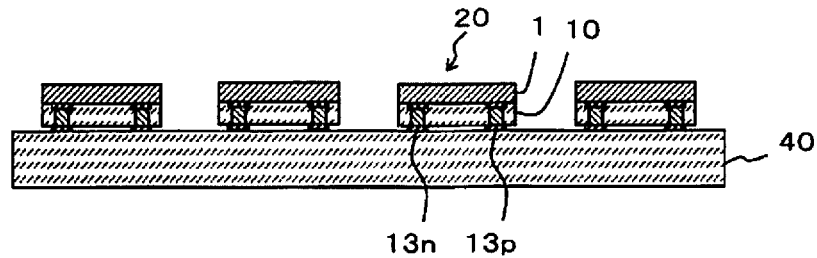

Subsequently, in the light emitting element arranging step S15, as shown in FIG. 5A, the light emitting elements 20 with the supporting bodies selected in the light emitting element selecting step S14 are arranged apart from each other with their side surfaces exposed, on a sheet (or jig substrate) 40 having an adhesive surface. At this time, the light emitting element 20 with the supporting body is arranged so that the surface having the supporting body 10 faces downward, that is, the surface having the pad electrodes 13n and 13p is opposed to the sheet 40. The sheet 40 may be a dicing sheet of a semiconductor wafer made of a resin such as vinyl chloride. For example, the dicing tape V-8-S manufactured by NITTO DENKO CORPORATION may be used.

As for the sheet 40, a UV (ultraviolet)-curing type resin may be formed as an adhesive agent on the surface on which the light emitting element 1 is set. In the mounting step S17 which will be described below, the adhesive resin is cured by irradiating the sheet 40 with UV light so that the adhesiveness can disappear. In this way, with a collet 50 and a pin 51 (refer to FIG. 5C), for example, the light emitting element 20 with the supporting body and the phosphor layer 7, that is, the light emitting device 100 can be easily removed from the sheet 40.

Figure 5B:
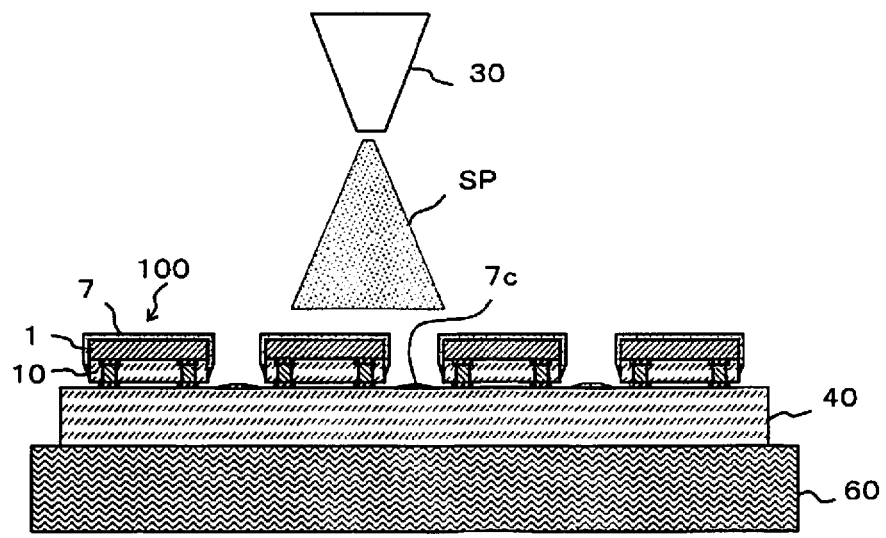

Subsequently, in the phosphor layer forming step (wavelength conversion layer forming step) S16, as shown in FIG. 5B, the phosphor layer 7 is formed by injecting a spray SP of a slurry as a raw material of the phosphor layer 7 from a spray device 30 onto the sheet 40 on which the light emitting elements 20 with the supporting bodies are arranged. In the present embodiment, the sprayed phosphor layer 7 is heated by a heating device 60 to cure the thermosetting resin contained in the phosphor layer 7.

The light emitting elements 20 with the supporting bodies may be arranged in a one-dimensional manner or two-dimensional manner. In either case, the light emitting elements 20 with the supporting bodies are arranged apart from each other with their side surfaces exposed. The sheet 40 is set on a stage, and this stage and the spray device 30 are configured so as to be relatively moved at least in a horizontal direction. Thus, the phosphor layer 7 is formed on the upper surface and the side surfaces of each light emitting element 20 with the supporting body, by spray coating.

As for the side surface portion 7b of the phosphor layer 7 formed on the side surface portion of the light emitting element 20 with the supporting body by the spray coating, as shown in FIG. 1A, while the uniform thickness is provided at least from the position HA at the upper end to the position HB at the lower side-surface end of the semiconductor stacked layer body 3, the thickness of the phosphor layer 7 formed by spray coating becomes thin downwardly from the position HB. In addition, the phosphor layer 7 is formed such that the position HD at the lower end of the side surface portion 7b is the same as the position HE or higher than the position HE at the lower side-surface end of the resin layer 11 of the supporting body 10.

When the spray coating is performed for the light emitting element 20 with the supporting body from above, a phosphor layer 7c is formed on the sheet 40 provided between the light emitting elements 20 with the supporting bodies, similar to the surfaces of the light emitting element 20 with the supporting body. When the spray coating is performed so that the phosphor layer 7 having the above-described configuration can be formed on the upper surface and the side surfaces of the light emitting element 20 with the supporting body, the phosphor layer 7 on the light emitting device 100 and the phosphor layer 7c on the sheet 40 are formed separately from each other.

Figure 6A:
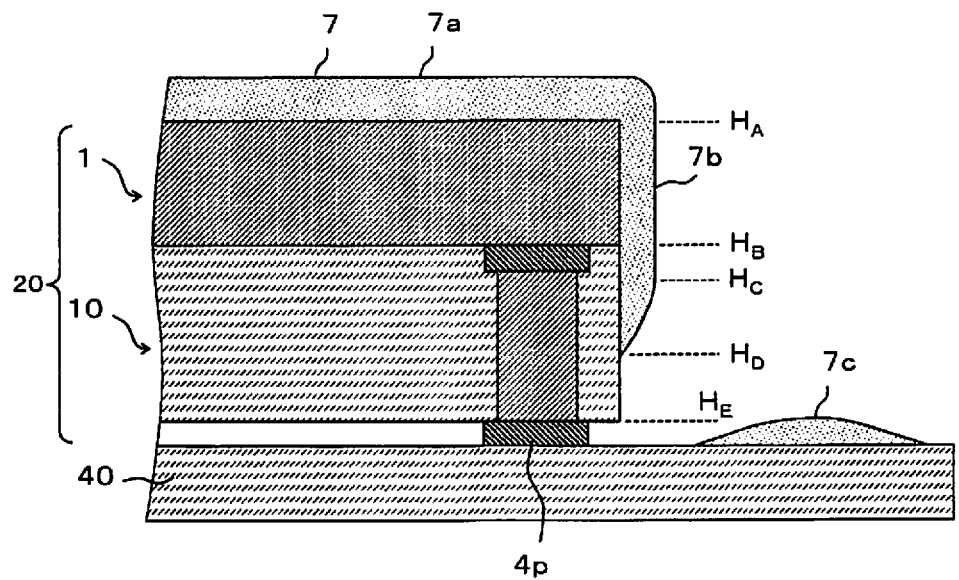
Figure 6B:
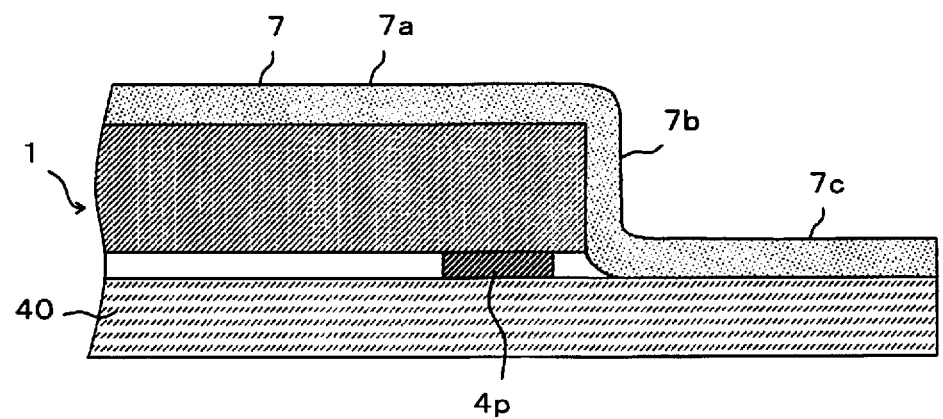

With reference to FIGS. 6A and 6B, a description will be given to a state of forming the phosphor layer 7 on the light emitting element 1 increased in height with the supporting body 10 and a state of forming the phosphor layer 7 on the light emitting element 1 not having the supporting body, by spray coating from above. As shown in FIG. 6B, in the case where the supporting body is not provided, a distance is short between the upper surface of the light emitting element 1 and the upper surface of the sheet 40 on which the light emitting element 1 is arranged, so that the phosphor layer 7 is continuously formed on the upper surface and the side surfaces of the light emitting element 1, and the upper surface of the sheet 40. Therefore, for the singulation of the light emitting element 1 having the phosphor layer 7 thereon, a step of cutting the resin-containing phosphor layer 7 is required. When the spray coating is performed under the condition that the phosphor layer 7 is not formed at the lower end portion of the light emitting element 1, the phosphor layer 7 formed on the side surfaces of the light emitting element 1 cannot have an enough thickness, and the thickness cannot be uniform. Since the phosphor layer 7 is not provided at the lower portion of the side surface of the light emitting element 1, the light (such as blue light) is leaked from the light emitting element 1 without being converted. Furthermore, in cutting the phosphor layer 7, burr is generated at a cut portion, which could cause the phosphor layer 7 to be peeled.

Meanwhile, as shown in FIG. 6A, in the case where the supporting body 10 is provided, a distance is long between the upper surface of the light emitting element 1 (position HA) and the upper surface of the sheet 40. Therefore, it becomes possible to set the condition of the spray coating so that the phosphor layer 7 having almost the uniform thickness is formed on the side surface (at least from the position HA to the position HB) of the light emitting element 1, and the phosphor layer 7 is not formed at the lower end (position HE) of the side surface of the supporting body 10. In the phosphor layer forming step S16, the light emitting device 100 can be formed with the light emitting element kept in the singulated state, so that there is no need to singulate the light emitting element by cutting the phosphor layer 7 formed on the light emitting device 100 from the phosphor layer 7c formed on the sheet 40, or the like. Since the phosphor layer 7 can be thinly formed on the lower side-surface portion 7b2 of the phosphor layer 7 without generating the burr, the light emitting device 100 can be mounted on the mounting substrate with a narrow pitch, so that a packaging density of the components can be improved.

In addition, it is possible to adjust the region of the upper side-surface portion 7b1 having the uniform thickness, and the region of the lower side-surface portion 7b2, that is, the position HC to the position HD shown in FIG. 1A having the decreasing thickness in the downward direction, by altering a prescription of the slurry to be sprayed, a sprayed amount, and a condition of a temporary curing process. For example, as a solvent ratio in the slurry is increased, or as the sprayed amount of the slurry is increased, or as a temperature of the temporary curing process is lowered, the region of the upper side-surface portion 7b1 and the lower side-surface portion 7b2 can be elongated and reach the lower part. On the contrary, as the solvent ratio in the slurry is reduced, or as the sprayed amount of the slurry is reduced, or as the temperature of the temporary curing process is raised, the region of the upper side-surface portion 7b1 and the lower side-surface portion 7b2 can be shortened.

As described above, it is preferable that, when the phosphor layer 7 is formed by spray coating, the phosphor layer 7 formed on the side surface of the supporting body 10 is separated from the phosphor layer 7c formed on the sheet 40, but they may be continuously formed. Even when the phosphor layer 7 and the phosphor layer 7c are continuously formed, the phosphor layer 7 is thinner in the vicinity of the lower end (position HE) of the supporting body 10 than at least the side surface portion of the light emitting element 1 because the light emitting element 1 is increased in height with the supporting body 10. Therefore, when the light emitting device 100 is picked up with a collet 50 and a pin 51, in the mounting step S17, the phosphor layer 7 can be torn off in the vicinity of the lower end portion (position HE) of the side surface of the supporting body 10 and easily separated from the phosphor layer 7c on the sheet 40. When an expandable sheet is used as the sheet 40 and the sheet 40 is expanded in a sheet in-plane direction after the phosphor layer 7 has been formed, the phosphor layer 7 can be torn off and easily separated from the phosphor layer 7c on the sheet 40.

The spray device 30 is not limited in particular, but the spray device 30 preferably employs a pulsed spray method in which the spray SP is injected in a pulsed way, that is, intermittently. The intermittent spraying can reduce an injection amount per unit time. Therefore, the spray device 30 sprays a small amount of slurry while being moved at low speed, so that the slurry can be uniformly applied to the side surface and a corner portion of the uneven spray surface. In addition, the pulsed spray method can reduce an air velocity without reducing a spray velocity of the slurry from a nozzle, compared with a continuous spray method. Therefore, when the pulsed spray method is used, the slurry can be preferably supplied to the surface similarly to the continuous spray method, and in addition, the applied slurry is not disturbed by an air flow. As a result, the sprayed film can be high in adhesiveness between the particles of the phosphor and the surface of the light emitting element 1.

Since the pulsed spray method can reduce the spray amount, a thin film can be formed by reducing the spray amount applied at one time of the spraying process. Thus, by repeating the spraying process several times, the phosphor layer 7 having the highly precise thickness can be formed as a stacked layer body of the thin film sprayed layers. In addition, by performing the temporary curing process to the thermosetting resin with respect to each time or several times (three times, for example) of the spraying process, the uniform phosphor layer 7 having the highly precise thickness can be formed without causing dripping on the side surface portion. The pulsed spray method and the temporary curing process will be described in detail below.

Furthermore, the slurry to be applied by the spray device 30 contains a solvent, a thermosetting resin, and a granular phosphor. An inorganic filler may be further added to the slurry. In addition, the slurry can be sprayed and is adjusted so as to have appropriate viscosity so that a slurry applied on the side surface portion of the light emitting element 20 with the supporting body does not drip.

The thermosetting resin is not limited in particular as long as it has favorable light transmissive properties for the wavelength of light emitted from the light emitting element 1 and the wavelength of light emitted from the phosphor contained in the phosphor layer 7, and the above silicone resin, epoxy resin, and urea resin can be used. Specifically, an example of the thermosetting resin includes a silicone resin manufactured by Shin-Etsu Chemical Co., Ltd. (product name: LPS-3541). Furthermore, as the solvent, organic solvents such as n-hexane, n-heptane, toluene, acetone, and isopropanol may be used.

In addition, it is preferable that the thermosetting resin which is in a solid state at room temperature is dissolved in a solvent when used. This makes it possible to cure the phosphor layer 7 formed of applied slurry to have appropriate hardness by the temporary curing process.

Here, the temporarily curing means that the solvent contained in the phosphor layer 7 is evaporated and the phosphor layer 7 is incompletely cured by heating for a predetermined time at a predetermined temperature lower than the curing temperature at which the thermosetting resin completely causes a cross-linking reaction. That is, the amount of the solvent evaporated can be controlled by controlling the heating temperature and the heating time in the temporary curing process, and as a result, the hardness of the phosphor layer 7 can be adjusted. Furthermore, final curing means that the thermosetting resin is cured due to cross-linking reaction by heating for a predetermined time at a predetermined temperature equal to or higher than the temperature (curing temperature) at which the thermosetting resin causes cross-linking reaction. In addition, during the final curing process, the solvent contained in the phosphor layer 7 is almost completely evaporated.

A prescription example of the slurry is shown below.
Thermosetting resin: silicone resin (LPS3541)
Solvent: n-heptane
Phosphor:thermosetting resin:solvent (mass ratio)=15:10:15

Furthermore, the constituents of the slurry is preferably adjusted so that the slurry has a viscosity of 0.01 to 1000 mPa·s (mm Pascal/sec), and more preferably 0.1 to 100 mPa·s. When the slurry has the viscosity within this range, the slurry can be uniformly sprayed and excessive dripping can be prevented after sprayed.

In the pulsed spray method, the slurry containing the phosphor, the resin, and the solvent and having a low phosphor concentration is applied to a workpiece (spray target body) with a two-fluid nozzle capable of simultaneously spraying gas and liquid, while respectively being turned ON/OFF in a pulsed way. The workpiece is previously warmed up, so that the solvent is instantaneously evaporated on a surface of the workpiece and the extremely thin layer containing the phosphor can be formed. That is, the spraying process and the temporary curing process can be substantially performed at the same time. By repeating the above processes, the phosphor layer 7 can be formed so as to have the laminated thin resin films each containing the phosphor.

Figure 7:
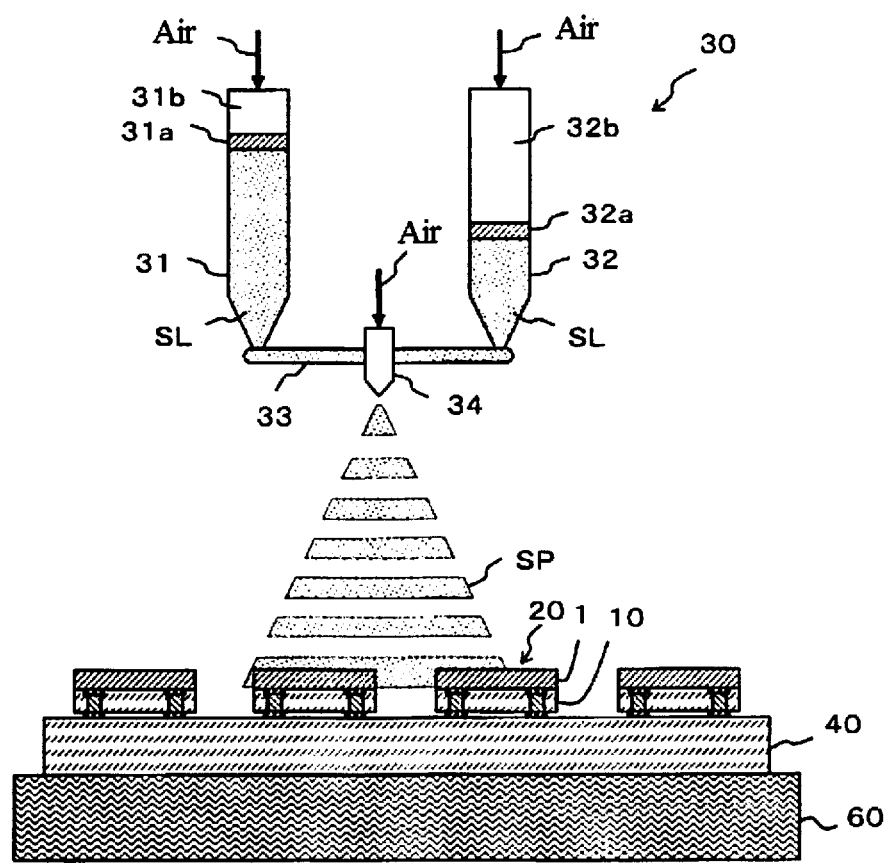
FIG. 7 is a schematic cross-sectional view showing an example of a spray device for spraying a slurry containing a resin and granular phosphor, in a method of manufacturing a light emitting device according to the first embodiment of the present invention.

Here, an example of the spray device 30 will be described with reference to FIG. 7. The spray device 30 shown in FIG. 7 is suitable for spraying a slurry as a spray solution containing solid particles. That is, the spray device 30 is configured to constantly stir the slurry as the spray solution so that the solid particles in the slurry are evenly diffused all the time without being settled down, and the slurry having evenly diffused solid particles can be sprayed. Thus, the spray device 30 shown in FIG. 7 includes two syringes 31 and 32, a circulation path 33 for connecting lower ends of the syringes 31 and 32, and a valve 34 with a nozzle provided in the middle of the circulation path 33.

The syringe 31 is a cylindrical container internally including a plunger 31a and containing slurry SL. A lower end of the syringe 31 is narrowed, and the lower end communicates with the circulation path 33. Furthermore, a compressed air 31b is internally introduced from an upper end of the syringe 31 through a valve. Thus, the slurry SL in the syringe 31 is pressed by the introduced compressed air 31b through the plunger 31a.

The syringe 32 has the same configuration as that of the syringe 31 and internally contains slurry SL, and its narrowed lower end communicates with the circulation path 33. Therefore, the syringe 31 and the syringe 32 communicate with each other through the circulation path 33, so that the slurry SL internally contained in the syringes can be mixed with each other. Similar to the syringe 31, a compressed air 32b is internally introduced from an upper end of the syringe 32 through a valve. Thus, the slurry SL in the syringe 32 is pressed by the introduced compressed air 32b through the plunger 32a.

The valve 34 with the nozzle is provided in the middle of the circulation path 33, and configured to inject the slurry SL in the circulation path 33 from the nozzle having a downward opening. Furthermore, the valve 34 with the nozzle is configured to receive compressed air from an outside and inject the compressed air from the nozzle so that the slurry SL can be injected as the spray SP. Furthermore, the valve 34 with the nozzle is configured to be able to control the slurry amount and the compressed air amount to be injected from the nozzle by adjusting opening degrees of the corresponding valves.

Next, a description will be given to an operation for stirring the slurry SL in the spray device 30. The compressed air is supplied from a different compressed air source to the upper end of each of the syringes 31 and 32. The compressed air is supplied such that a pressure of the compressed air 31b introduced to the syringe 31, and a pressure of the compressed air 32b introduced to the syringe 32 are pulsated in different phases (opposite phases, for example). The spray device 30 can move the slurry SL back and forth between the syringes 31 and 32 through the circulation path 33, and as a result, the slurry SL can be stirred.

The slurry SL is constantly stirred, so that the slurry SL having the uniformly diffused phosphor serving as the solid particles is circulated in the circulation path 33 all the time.

When the slurry SL circulated in the circulation path 33 is injected by the valve 34 with the nozzle, the spray SP evenly containing the phosphor particles can be injected. It is to be noted that the method of stirring and supplying the slurry is not limited to the above method, and as another method, a circulation pump may be put between the nozzle and syringe so that the slurry can be stirred and supplied while being circulated like a loop shape. Thus, the method is to be selected according to a purpose of the spraying process and properties of the slurry.

Next, a description will be given to the spraying process by the pulsed spray method with the spray device 30. As described above, by the pulsed spray method, the spray SP is injected in the pulsed way, that is, intermittently. By adjusting the valve opening degree of the valve 34 with the nozzle in the spray device 30, the injected amount of the spray SP can be controlled. As a simple method, the opening degree of the valve is set at two stages such as "open" and "closed", and the opening and closing are controlled at a predetermined cycle and a duty ratio, so that the pulsed spraying process can be performed. The opening and closing timing of the valves may be set so that the slurry SL and the compressed air are supplied at the same time, or the opening timing of the valve for the compressed air may be set longer. Furthermore, in order to keep the injected amount of the spray SP per unit time with high precision, a cycle of the opening and closing of the valve is preferably set at 30 times to 3600 times per minute.

The pulsed spray method and the spray device suitable for spraying the slurry are described in detail in Reference document 1 and Reference document 2, so that a further description is omitted. (Reference document 1) JP 61-161175 A (Reference document 2) JP 2003-300000 A Referring to FIGS. 5A to 5C again (refer to FIGS. 1A to 3 occasionally), the manufacturing step will be described again. In the phosphor layer forming step S16, a heating method of the heating device 60 for curing the sprayed phosphor layer 7 is not limited in particular, and an appropriate heater or oven may be used such as a heater in contact with a lower surface of the sheet 40 as shown in FIG. 5B, or infrared radiation. In the case where the phosphor layer 7 is formed in such a manner that the resin thin films each containing the phosphor are laminated by the spraying process performed several times, a heating temperature and/or a heating time of the heating device 60 are to be adjusted so that the phosphor layer 7 is temporarily cured after one or more predetermined number of thin films have been laminated, and finally cured after all of the thin films have been laminated.

For example, in the case where the slurry provided according to the above-described precipitation example is used, the curing process can be performed under the following condition, for example.

(Film Formation by Spray Coating)

As the phosphor layer 7, three layers are laminated while the splay amount for one layer is set to about 0.7 mg/cm2.

(Temporary Curing)

A heating process is performed for 5 minutes at 150 □C in an oven every time the three layers are laminated, as the temporary curing process.

(Final Curing)

In a case where the phosphor layer 7 is formed by laminating the nine layers in total while the temporary curing process is performed under the above condition, a heating process is performed for 4 hours at 180 □C in an oven, as the final curing process.

Figure 5C:
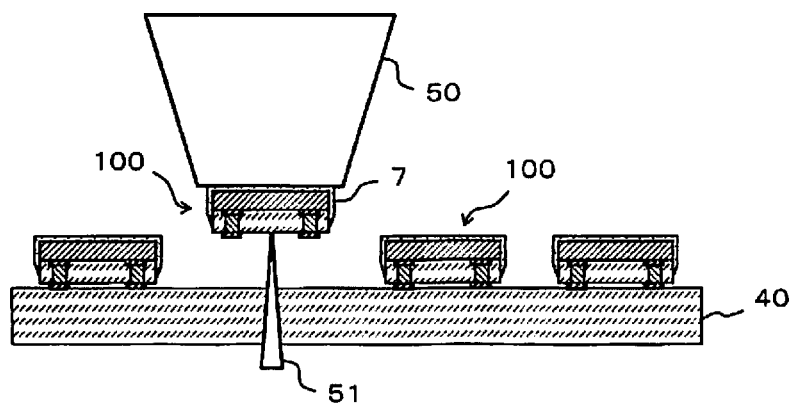

Subsequently, in the mounting step S17, the light emitting device 100 is picked up one by one with collet 50 and the pin 51 as shown in FIG. 5C, and set on the mounting region 94 of the mounting substrate 9 as shown in FIGS. 2A and 2B. More specifically, the collet 50 absorbs the phosphor layer 7 provided on the upper surface of the light emitting device 100, and the pin 51 pushes up the lower surface of the light emitting device 100 from the back surface side of the sheet 40. In this way, the light emitting device 100 can be easily removed from the sheet 40. In the example shown in FIG. 5C, as described above, the pin 51 gets through the sheet 40 to push up the light emitting device 100, but as other configuration, the expandable sheet is used as the sheet 40, and the pin 51 may push up the light emitting device 100 together with the sheet 40.

In the case where the sheet 40 has the UV-curing resin layer as the adhesive agent to hold the light emitting device 100, the sheet 40 is to be irradiated with UV light so that the adhesive agent is cured and its adhesiveness disappears before the light emitting device 100 is picked up with the collet 50 and the pin 51. Thus, the light emitting device 100 can be more easily removed from the sheet 40.

After the light emitting devices 100 are set on all of the mounting regions 94, the solder layers as the negative electrode connection layer 93n and the positive electrode connection layer 93p are dissolved by heat in a reflow device. The n-side electrode 4n is electrically connected to the negative side wiring electrode 92n, and the p-side electrode 4p is electrically connected to the positive side wiring electrode 92p in each light emitting device 100, whereby the mounting of the light emitting devices 100 to the mounting substrate 9 is completed.

As described above, the solder bonding method by heat is preferably used to bond the electrode of the face-down mounting type light emitting device 100 to the electrode of the mounting substrate 9. Compared with the flip-chip mounting which is a bonding method using a pressure or ultrasonic vibration, a mechanical load is not applied to the phosphor layer 7 as the resin layer provided on the upper surface of the light emitting device 100, so that a damage such as a crack in the phosphor layer 7 can be prevented from occurring.

The light emitting devices 100 may be sealed with a sealing member such as a resin or glass after the electrodes are bonded. Through the above steps, the light emitting device 110 with the mounting substrate is completed.

<Other Variations of Light Emitting Device>

Next, other variations of the light emitting device according to the first embodiment of the present invention will be described with reference to FIGS. 8A and 8B (refer to FIGS. 1A to 2B occasionally).

Configuration of Light Emitting Device

The light emitting device in the present invention is not limited to the face-down mounting type such as the light emitting device 100 shown in FIG. 1A or the light emitting device 100A shown in FIG. 1B. A light emitting device 100B as a variation shown in FIG. 8A is a face-up mounting type, and a light emitting device 100C as a variation shown in FIG. 8B is a vertical mounting type.

(Face-Up Mounting Type)

Figure 8A:
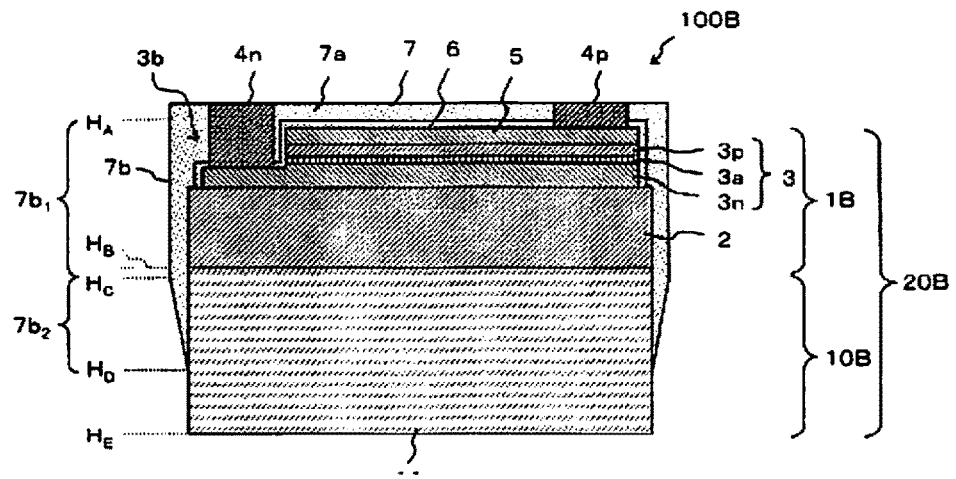

As shown in FIG. 8A, in the face-up mounting type light emitting device 100B, a surface having the semiconductor stacked layer body 3 of a light emitting element 1B is a light extracting surface, and a supporting body 10B is provided on the lower surface of the growth substrate 2. The phosphor layer 7 is provided on an upper surface and side surfaces of a light emitting element 20B with the supporting body which is composed of the light emitting element 1B and the supporting body 10B. In addition, the n-side electrode 4n and the p-side electrode 4p are exposed in the upper surface portion 7a of the phosphor layer 7, and are to be connected respectively to the negative side wiring electrode 92n and the positive side wiring electrode 92p of the mounting substrate 9 shown in FIGS. 2A and 2B by wire bonding.

In the light emitting element 20B with the supporting body, light is extracted from the entire upper surface and the entire side surfaces of the light emitting element 1B. Therefore, the light emitting element 20B with the supporting body has the upper side-surface portion 7b1 having the uniform thickness at least from an upper surface (position HA) of the light emitting element 1B to a lower surface (position HB) of the light emitting element 1B. In this example, the upper side-surface portion 7b1 reaches the position HC which is the middle of the side surface portion of the supporting body 10B. In addition, as for the lower side-surface portion 7b2 having the smaller thickness than the upper side-surface portion 7b1 in the side surface portion 7b of the phosphor layer 7, its lower end, that is, the position HD is the same as the position HE or higher than the position HE at the lower end of the supporting body 10B.

The overall electrode 5 provided on the upper surface of the p-type semiconductor layer 3p is made of a light transmissive conductive material such as ITO (indium tin oxide). The supporting body 10B provided on the lower surface of the growth substrate 2 may be composed of the resin layer 11 containing the light reflective inorganic filler so as to function as a reflecting member. In the case of the face-up mounting type, it is not necessary to provide the electrode on the lower surface of the light emitting device 100B, so that unlike the supporting body 10 shown in FIG. 1A, the supporting body 10B does not have the conductive members 12n and 12p and the pad electrodes 13n and 13p, and the supporting body 10B is only composed of the resin layer 11. In addition, a DBR (Distributed Bragg Reflector) film, a metal film, or a reflecting layer provided by combining the above films may be provided between the growth substrate 2 and the supporting body 10B, instead of or in addition to containing the light reflective inorganic filler in the resin layer 11. Furthermore, instead of the resin layer 11, an inorganic material layer of glass or metal may be used.

(Vertical Mounting Type)

Figure 8B:
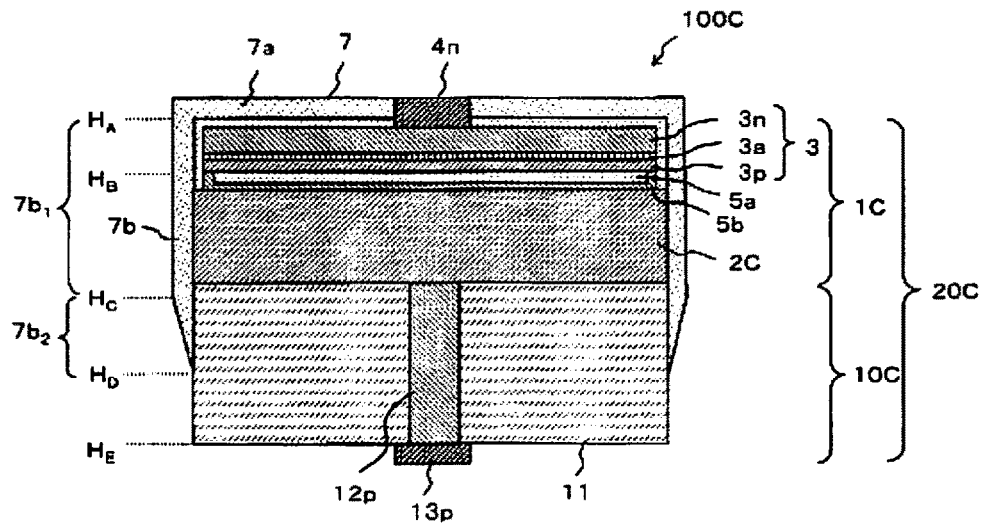

As shown in FIG. 8B, the vertical mounting type light emitting device 100C includes a light emitting element 1C in which the growth substrate 2 is removed, and a conductive supporting substrate 2C is provided adjacent to the p-type semiconductor layer 3p with the overall electrode 5a and the cover electrode 5b interposed therebetween. In the light emitting element 1C, the n-type semiconductor layer 3n serves as the light extracting surface, and a supporting body 10C is provided on a lower surface of the supporting substrate 2C. The phosphor layer 7 is provided on an upper surface and side surfaces of a light emitting element 20C with the supporting body which is composed of the light emitting element 1C and the supporting body 10C. The n-side electrode 4n is exposed on the upper surface portion 7a of the phosphor layer 7, so that the n-side electrode 4n can be connected to the negative side wiring electrode 92n of the mounting substrate 9 shown in FIGS. 2A and 2B by wire bonding, for example.

In the light emitting element 20C with the supporting body, light is extracted from the entire upper surface and the entire side surfaces of the semiconductor stacked layer body 3. Thus, the light emitting element 20C with the supporting body has the upper side-surface portion 7b1 having the uniform thickness at least from the upper surface (position HA) of the semiconductor stacked layer body 3 to the lower surface (position HB) of the semiconductor stacked layer body 3. The upper side-surface portion 7b1 reaches the position HC which is the middle of the side surface portion of the supporting body 10B, but the upper side-surface portion 7b1 may reach the middle of the side surface of the supporting substrate 2C in this example. In addition, as for the lower side-surface portion 7b2 having the thickness smaller than the upper side-surface portion 7b1 in the side surface portion 7b of the phosphor layer 7, its lower end, that is, the position HD is the same as the position HE or higher than the position HE at the lower end of the supporting body 10B.

The supporting body 10C provided on the lower surface of the conductive supporting substrate 2C does not need to function as the reflecting member, so that the supporting body may be made of the resin layer 11 not containing the light reflective inorganic filler. In addition, the supporting substrate 2C of the light emitting element 1C also functions as the p-side electrode, and the supporting body 10C has the through hole penetrating the resin layer 11 in the thickness direction, and the conductive member 12p is provided in the through hole. The pad electrode 13p is provided at the lower end portion of the conductive member 12p. In the vertical mounting type light emitting device 100C, the n-side electrode 4n serving as one electrode is electrically connected to the negative side wiring electrode 92n of the mounting substrate 9 shown in FIGS. 2A and 2B by wire bonding as described above, and the p-side pad electrode 13p serving as the other electrode is electrically connected to the positive side wiring electrode 92p with a solder. The resin layer 11 may be made of an insulating inorganic material such as glass, and the whole supporting body 10C may be composed of a metal layer.

Operation of Light Emitting Device (Face-Up Mounting Type)

Next, an operation of the light emitting device 100B will be described with reference to FIG. 8A (refer to FIGS. 2A and 2B occasionally). The description will be given on the condition that the light emitting device 100B is mounted on the mounting substrate 9 shown in FIGS. 2A and 2B in the same manner described above, the light emitting element 1B emits blue light, and the phosphor layer 7 emits yellow light, for convenience of the description. A path of the light after being emitted from the light emitting device 100B is the same as that of the light emitting device 100 shown in FIG. 1A, so that its description is omitted. The same is true in a description of the light emitting device 100C.

In the light emitting device 100B shown in FIG. 8A, when a current is supplied between the p-side electrode 4p and the n-side electrode 4n of the light emitting element 1B through the mounting substrate 9 shown in FIGS. 2A and 2B and a bonding wire, the light emitting layer 3a of the light emitting element 1B emits blue light.

The blue light emitted from the light emitting layer 3a of the light emitting element 1B is propagated in the semiconductor stacked layer body 3 and the growth substrate 2, and emitted from the upper surface or the side surfaces of the light emitting element 1B. This light is partially absorbed by phosphor particles in the phosphor layer 7, converted to yellow light, and externally extracted. In addition, the blue light partially passes through the phosphor layer 7 without being absorbed and externally extracted. The light propagated downward in the light emitting element 1B is reflected upward by the resin layer 11 having the light reflective inorganic filler in the supporting body 10B, and emitted from the upper surface or the side surfaces of the light emitting element 1B.

(Vertical Mounting Type)

Next, an operation of the light emitting device 100C will be described with reference to FIG. 8B (refer to FIGS. 2A and 2B, occasionally). In the light emitting device 100C shown in FIG. 8B, when a current is supplied between the supporting substrate 2C serving as the p-side electrode C and the n-side electrode 4n in the light emitting device 100C through the mounting substrate 9 shown in FIGS. 2A and 2B, a bonding wire, the pad electrode 13p, and the conductive member 12p, the light emitting layer 3a of the light emitting element 1B emits blue light.

The blue light emitted from the light emitting layer 3a of the light emitting element 1C is propagated in the semiconductor stacked layer body 3, and emitted from the upper surface or the side surfaces of the semiconductor stacked layer body 3. This light is partially absorbed by phosphor particles in the phosphor layer 7, converted to yellow light, and externally extracted. In addition, the blue light partially passes through the phosphor layer 7 without being absorbed, and externally extracted. The light propagated downward in the semiconductor stacked layer body 3 is reflected upward by the overall electrode 5a, and emitted from the upper surface or the side surfaces of the semiconductor stacked layer body 3.

Method of Manufacturing Light Emitting Device

Next, a method of manufacturing each of the light emitting device 100B and the light emitting device 100C will be described. Each of the light emitting device 100B and the light emitting device 100C can be manufactured by sequentially performing the steps from the light emitting element preparing step S11 to the phosphor layer forming step S16, similar to the method of manufacturing the light emitting device 100 shown in FIG. 3.

In the light emitting element preparing step S11, the face-up mounting type light emitting elements 1B and the vertical mounting type light emitting elements 1C are manufactured as wafers by known methods, respectively, and detailed descriptions are omitted. Furthermore, the singulating step S13, the light emitting element selecting step S14, the light emitting element arranging step S15, and the phosphor layer forming step S16 are the same as the corresponding steps for the light emitting device 100, so that their descriptions are omitted. Hereinafter, the supporting body forming step S12 will be described.

(Face-Up Mounting Type)

First, a description will be given to the case of the face-up mounting type light emitting device 100B. In the supporting body forming step S12, the resin layer 11 is formed on the back surface of the growth substrate 2 of the light emitting elements 1B in the wafer state by spin coating, spray coating, casting, or the like. Thus, the light emitting elements 20B with the supporting body in the wafer state are formed. Furthermore, the back surface of the resin layer 11 may be cut or polished to adjust the thickness of the resin layer 11.

(Vertical Mounting Type)

Next, a description will be given to the case of the vertical mounting type light emitting device 100C. In the supporting body forming step S12, the resin layer 11 is formed on the back surface of the supporting substrate 2C of the light emitting elements 1C in the wafer state by spin coating, spray coating, casting, or the like. Similar to the supporting body 10 of the light emitting device 100, the through hole is formed in the resin layer 11, the conductive member 12p is formed in the through hole, and the pad electrode 13p is formed at the lower end of the conductive member 12p. Thus, the wafer-state light emitting elements 20C with the supporting body are formed.

In the phosphor layer forming step S16 for the face-up mounting type light emitting device 100B or the vertical mounting type light emitting device 100C, the electrode portion (4n and 4p, or 4n) provided on the light extracting surface is exposed in the following manner. First, a protection film is formed of a water-soluble resist in a region to expose the electrode portion, and then the phosphor layer 7 is formed by spray coating. After that, the water-soluble resist is washed with water and removed together with the phosphor layer 7 formed on the water-soluble resist. Thus, the electrode portion can be exposed. Alternatively, after the phosphor layer 7 is formed in the region including the electrode portion by spray coating, the phosphor layer 7 on the electrode portion may be removed by laser abrasion or the like, whereby the electrode portion can be exposed.

As described above, the light emitting device 100B and the light emitting device 100C can be manufactured. Furthermore, as described above, the mounting substrate 9 shown in FIGS. 2A and 2B mounts the light emitting device 100B thereon with the wire, and the light emitting device 100C with the wire and solder.

Second Embodiment

Configuration of Light Emitting Device

Figure 9:
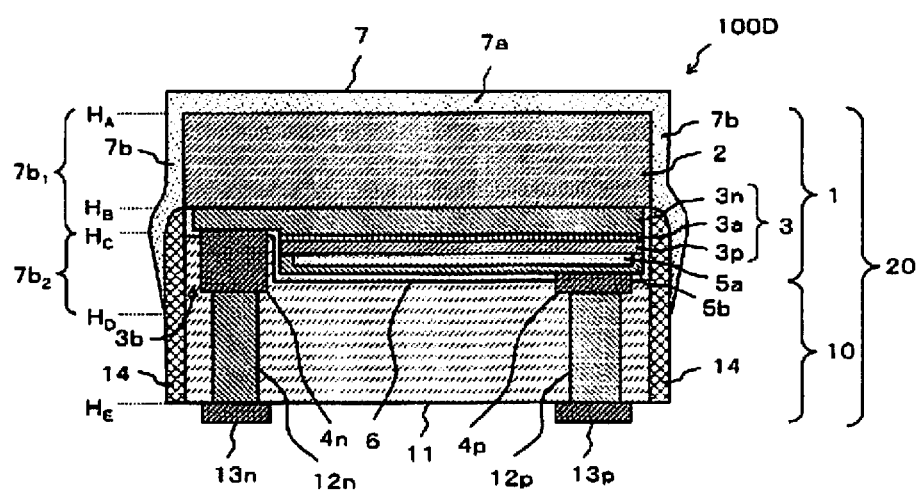
FIG. 9 is a schematic cross-sectional view showing a configuration of a light emitting device according to a second embodiment of the present invention.

Next, a light emitting device according to a second embodiment will be described with reference to FIG. 9. As shown in FIG. 9, in a light emitting device 100D in the second embodiment, a light reflecting resin layer 14 is formed on the side surfaces of the supporting body 10, and the phosphor layer 7 is formed so as to cover an outer side of the reflecting resin layer 14. In a case where the resin layer 11 of the supporting body 10 is made of a light transmissive material, the light can be reflected and returned to the light emitting element 1 after being leaked from the lower surface and the side surfaces of the light emitting element 1 and propagated in the resin layer 11, so that there is an improvement in light extracting efficiency from the upper surface serving as the light extracting surface of the light emitting element 1. The light transmissive resin material also contains an element which partially absorbs the light inputted in the resin.

The reflecting resin layer 14 is made of a light transmissive resin containing a light reflective filler. The light transmissive resin includes the one having favorable light transmittance among the resin materials used for the resin layer 11 or the phosphor layer 7. In addition, the light reflective filler may be the above-described inorganic filler for giving light diffusion properties to the phosphor layer 7.

As described above, the light emitting element 1 emits the light not only from the upper surface but also from the side surfaces, so that the reflecting resin layer 14 may be provided so as to entirely or partially cover the side surfaces of the light emitting element 1 in addition to the side surfaces of the resin layer 11 serving as the side surfaces of the supporting body 10. In the example shown in FIG. 9, the position HB at the upper end of the reflecting resin layer 14 corresponds to a position of the upper surface of the semiconductor stacked layer body 3. That is, the reflecting resin layer 14 covers the entire side surfaces of the semiconductor stacked layer body 3 in addition to the entire side surfaces of the resin layer 11. Therefore, in the light emitting device 100D, the light is extracted from the upper surface and the side surfaces of the growth substrate 2 which are not covered with the reflecting resin layer 14.

Thus, the phosphor layer 7 is formed such that the upper side-surface portion 7b1 having the uniform thickness is provided from the position HA at the upper surface of the growth substrate 2 to the position HC lower than the position HB which corresponds to the end of the light emission side surface of the light emitting element 1, that is, the lower surface of the growth substrate 2, and the lower side-surface portion 7b2 is provided from the position HC to the position HD higher than the position HE at the lower end of the supporting body 10. The position of the upper end of the reflecting resin layer 14 may be at least the same as or higher than the upper end of the side surface of the resin layer 11, and may be between the position HA at the upper end and the lower end of the side surface of the growth substrate 2.

In addition, the position HC may be at least the same as the position HB or lower than the position HB, and the position HC is preferably close to the position HB. The position HD may be at least the same as the position HE or higher than the position HE, and the position HD is preferably close to the position HC. Thus, it is possible to prevent the light of the color converted by the phosphor from being excessively emitted from under the light extracting surface.

In addition, when the reflecting layer 95 (refer to FIGS. 2A and 2B) of the mounting substrate 9 is formed to be extended and reach the lower surface position of the light emitting device 100D, the light leaking from the lower surface of the supporting body 10 can be reflected upward. Furthermore, the reflecting resin layer 14 may be provided so as to cover the lower surface of the supporting body 10 except for the regions of the pad electrodes 13n and 13p.

Operation of Light Emitting Device

The light emitting element 100D according to the present embodiment is the same as the light emitting device 100 according to the first embodiment shown in FIG. 1A except that the light is reflected by the reflecting resin layer 14, returned to the light emitting element 1, and extracted from the light extracting surface after being emitted from the light emitting element 1 and propagated in the resin layer 11 of the supporting body 10, so that its detailed description is omitted.

Method of Manufacturing Light Emitting Device

The light emitting device 100D according to the present embodiment can be manufactured by performing a step of forming the reflecting resin layer 14 on the side surfaces of the supporting body 10, between the light emitting element arranging step S15 and the phosphor layer forming step S16 in the method of manufacturing the light emitting device 100 according to the first embodiment shown in FIG. 3.

The step of forming the reflecting resin layer 14 can be performed as follows. For example, a slurry containing a reflective filler and a resin is sprayed to predetermined surfaces (the side surfaces, or the side surfaces and the lower surface) of the supporting body 10, a meniscus of the slurry is formed so as to only cover the predetermined surfaces of the supporting body 10, and the slurry is dried, whereby the reflecting resin layer 14 can be formed.

In addition, the reflecting resin layer 14 can be formed so as to have excellent adhesiveness with the phosphor layer 7 by the following process. First, a high-viscosity slurry containing the reflective filler and a thermosetting resin is applied to the desired regions of the side surfaces, or the side surfaces and the lower surface of the supporting body 10, from a pneumatic dispenser. Here, the slurry as the raw material of the reflecting resin layer 14 preferably has a viscosity higher than that of the slurry as the raw material of the phosphor layer 7. In the state that the reflecting resin layer 14 is not cured yet, the slurry as the raw material of the phosphor layer 7 is sprayed. Then, the reflecting resin layer 14 and the phosphor layer 7 are heated and temporarily cured. At this time, the reflecting resin layer 14 and the phosphor layer 7 are in contact with each other in the uncured state and then temporarily cured, so that the two resin layers can be bonded strongly with high adhesiveness. Furthermore, since the slurry as the raw material of the reflecting resin layer 14 has the high viscosity, the slurry is not excessively mixed with the phosphor layer 7 applied later, so that the phosphor layer 7 can be formed in a desired region with high precision.

In the light emitting element arranging step S15 (refer to FIG. 3), the expandable sheet may be used as the sheet 40 (refer to FIG. 5A) on which the light emitting element 20 with the supporting body is arranged. In this case, by expanding the sheet 40 after the reflecting resin layer 14 and the phosphor layer 7 have been formed, the reflecting resin layer 14 can be torn off and easily separated at the lower end portion of the light emitting element 20 with the supporting body. The light emitting device 100D can be mounted on the mounting substrate 9 (refer to FIGS. 2A and 2B) in the same manner as the light emitting device 100.

Third Embodiment

Configuration of Light Emitting Device

Figure 10A:
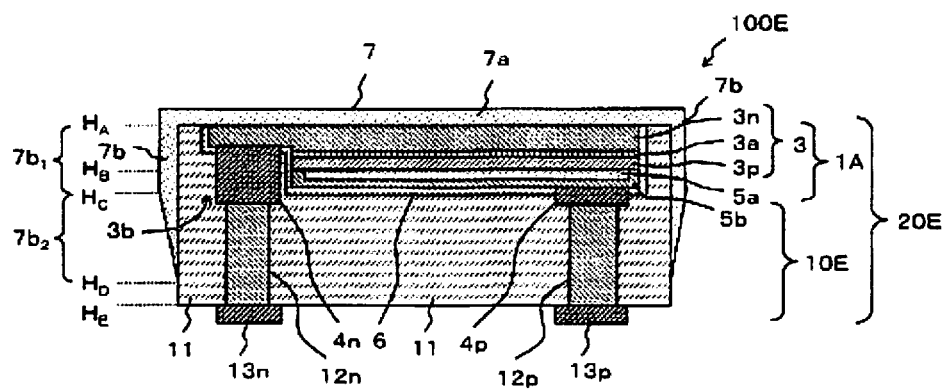
FIG. 10A is a schematic cross-sectional view showing a configuration of a light emitting element according to a third embodiment of the present invention.

Next, a light emitting device according to a third embodiment will be described with reference to FIG. 10A. As shown in FIG. 10A, a light emitting device 100E in the third embodiment differs from the light emitting device 100A shown in FIG. 1B in that a supporting body 10E is provided instead of the supporting body 10. The supporting body 10E is provided such that the resin layer 11 covers the side surfaces of the light emitting element 1A, in addition to the lower surface of the light emitting element 1A. In addition, the resin layer 11 is made of a favorably reflecting resin obtained by mixing a light reflective filler in a light transmissive resin.

In the light emitting device 100E in the present embodiment, since the side surfaces of the light emitting element 1A are covered with the reflecting resin layer 11, the light is not extracted from the side surfaces of the light emitting device 100E, and the light is only extracted from the upper surface of the light emitting device 100E. Therefore, the side surface portion of the phosphor layer 7 is not used for converting the wavelength, so that the position HD at the lower end of the side surface of the phosphor layer 7 may be at least the same as the position HE or higher than the position HE at the lower end of the side surface of the supporting body 10E, and the upper side-surface portion 7b1 and the lower side-surface portion 7b2 are preferably short. Other configurations are the same as those of the light emitting device 100A shown in FIG. 1B, so that a detailed description is omitted.

Operation of Light Emitting Device

The light emitting device 100E according to the present embodiment differs from the light emitting device 100A shown in FIG. 1B in a path of the light emitted from the side surfaces of the light emitting element 1A. In the light emitting device 100A, the light emitted from the side surface of the light emitting element 1A is externally extracted through the phosphor layer 7. Meanwhile, in the light emitting device 100E, the light emitted from the side surface of the light emitting element 1A is reflected by the resin layer 11 covering the side surface, returned into the light emitting element 1A, and externally extracted from the upper surface of the light emitting element 1A through the phosphor layer 7. Other paths are the same as those in the case where the light reflecting resin is used for the resin layer 11 of the light emitting device 100A, so that its description is omitted.

Method of Manufacturing Light Emitting Device

Figure 11A:
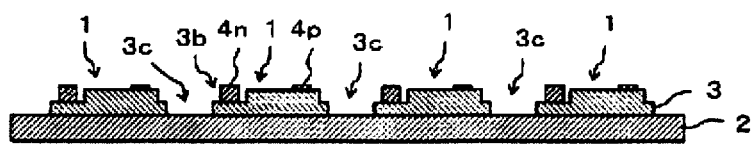

The light emitting device 100E according to the present embodiment can be manufactured by partially changing the method of manufacturing the light emitting device 100A. First, in the light emitting element preparing step S11 (refer to FIG. 3), as shown in FIG. 11A, the semiconductor stacked layer body 3 is completely etched away to expose the growth substrate 2 in a boundary region 3c between the light emitting elements 1 arranged on the growth substrate 2.

Figure 11B:
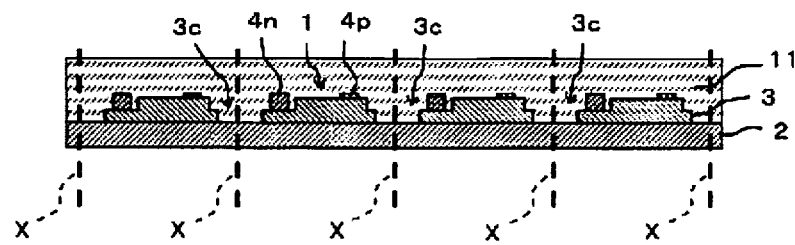

Subsequently, in the first sub step of the supporting body forming step S12 (refer to FIG. 3), as shown in FIG. 11B, the resin layer 11 serving as the base of the supporting body is formed on the entire surface of the wafer. At this time, the side surfaces of the semiconductor stacked layer body 3 of the light emitting element 1 are covered with the resin layer 11. After that, similar to the light emitting device 100A, the sub steps of the supporting body forming step S12 are performed, the growth substrate 2 is removed, the light emitting elements 1 are diced along the cut lines X in the singulating step S13 so that the resin layer 11 is left on the side surface portion of the light emitting element 1, whereby the light emitting device 100E is provided. Furthermore, the light emitting device 100E can be mounted on the mounting substrate 9 (refer to FIGS. 2A and 2B) in the same manner as the light emitting device 100.

Fourth Embodiment

Configuration of Light Emitting Device

Figure 10B:
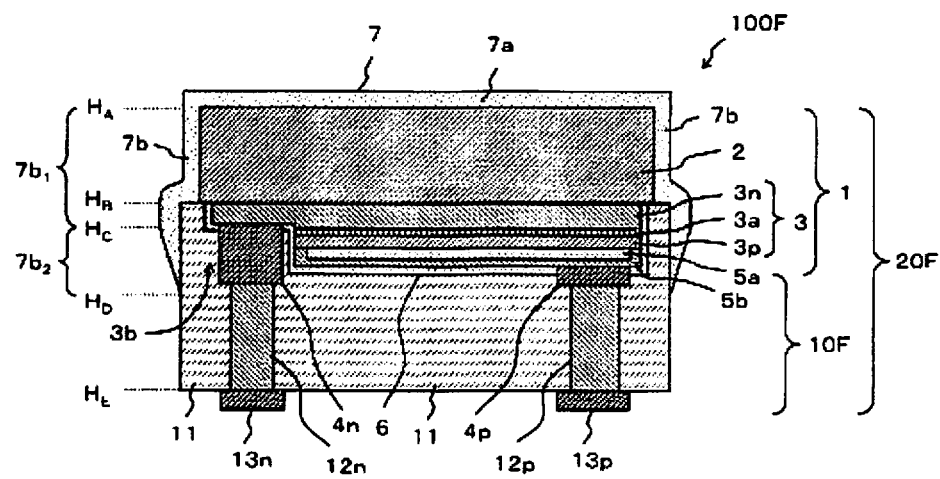
FIG. 10B is a schematic cross-sectional view showing a configuration of a light emitting element according to a fourth embodiment of the present invention.

Next, a light emitting device according to a fourth embodiment will be described with reference to FIG. 10B. As shown in FIG. 10B, a light emitting device 100F in the fourth embodiment differs from the light emitting device 100 shown in FIG. 1A in that a supporting body 10F is provided instead of the supporting body 10. The supporting body 10F is provided such that the resin layer 11 covers the side surfaces, in addition to the lower surface of the light emitting element 1. The light emitting device 100F is configured such that the growth substrate 2 is positioned on an inner side of the resin layer 11 of the supporting body 10F in a plan view. The resin layer 11 is made of a favorably reflecting resin provided by mixing a light reflective filler in a light transmissive resin.

In the light emitting device 100F in the present embodiment, since the side surfaces of the semiconductor stacked layer body 3 of the light emitting element 1 are covered with the light reflecting resin layer 11, the light is extracted from the upper surface and the side surfaces of the growth substrate 2 of the light emitting device 100F. Therefore, the side surface portion of the phosphor layer 7 under the position HB at the lower surface of the growth substrate 2 is not used for the wavelength conversion. Therefore, the position HC at the lower end of the upper side-surface portion 7b1 of the phosphor layer 7 may be at least the same as the position HB or lower than the position HB at the lower end of the light emission side surface of the light emitting element 1, that is, the lower end of the growth substrate 2, and the position HD at the lower end of the lower side-surface portion 7b2 may be at least the same as the position HE or higher than the position HE at the lower end of the supporting body 10F.

Operation of Light Emitting Device

The light emitting device 100F according to the present embodiment differs from the light emitting device 100 shown in FIG. 1A in a path of the light emitted from the side surfaces of the semiconductor stacked layer body 3 of the light emitting element 1. In the light emitting device 100, the light emitted from the side surfaces of the semiconductor stacked layer body 3 is externally extracted through the phosphor layer 7. Meanwhile, in the light emitting device 100F, the light emitted from the side surfaces of the semiconductor stacked layer body 3 is reflected by the resin layer 11 covering the side surfaces, returned into the light emitting element 1, and externally extracted from the upper surface of the light emitting element 1 or the side surfaces of the growth substrate 2 through the phosphor layer 7. Other paths are the same as those in the case where the light reflecting resin is used for the resin layer 11 of the light emitting device 100, so that its description is omitted.

Method of Manufacturing Light Emitting Device

The light emitting device 100F according to the present embodiment can be manufactured by partially changing the method of manufacturing the light emitting device 100. Similar to the method of manufacturing the light emitting device 100E, in the light emitting element preparing step S11 (refer to FIG. 3), the semiconductor stacked layer body 3 is completely etched away to expose the growth substrate 2 in the boundary region 3c (refer to FIG. 11A) between the light emitting elements 1 arranged on the growth substrate 2.

Subsequently, in the first sub step of the supporting body forming step S12 (refer to FIG. 3), as shown in FIG. 11B, the resin layer 11 serving as the base of the supporting body is formed on the entire surface of the wafer. At this time, the side surfaces of the semiconductor stacked layer body 3 of the light emitting element 1 are covered with the resin layer 11. In addition, before the singulating step S13 (refer to FIG. 3), that is, before the dicing is performed to completely singulate the boundary regions, grooves are formed in the growth substrate 2 along the cut lines X so as to reach inner sides of the resin layer 11. This groove may be diced by a diamond blade, or formed by wire cutting or laser scribing/abrasion. Furthermore, in a case where the growth substrate 2 is made of SiC or GaN, the groove can be formed into a more complicated shape to improve the light extracting efficiency. Due to this shape, the height increasing effect for the spray coating can be maintained, and the light propagated to the lower surface of the growth substrate 2 can be reflected to the upper surface by the resin layer 11 to be extracted, so that the LED can be high in light emission efficiency.

This structure of the growth substrate 2 may be formed after the light emitting element 1 has been increased in height with the supporting body 10F and arranged again on an adhesive jig sheet, or formed after half-dicing has been performed to the extend that the resin layer 11 is not completely cut but halfway cut from the state shown in FIG. 11B. Other steps are performed similarly to the light emitting device 100, whereby the light emitting device 100F is provided. Furthermore, the light emitting device 100F can be mounted on the mounting substrate 9 (refer to FIGS. 2A and 2B) in the same manner as the light emitting device 100.

As described above, according to the method of forming the phosphor layer in the present invention, compared with the method of forming the phosphor layer 7 using the electrodeposition method disclosed in JP 2003-69086 A, there is no need to form a specific layer such as a conductive layer, so that there are few restrictions in the structure and material of the light emitting element which can be used, and the method is high in degree of freedom. In addition, according to the method in the present invention, since the phosphor layer 7 is formed on the light emitting element 1 by the spray coating from above with the light emitting element 1 increased in height with the supporting body 10, the phosphor layer having the uniform thickness can be easily formed on the entire exposed surface of the light emitting element 1 in the simple manner for any structure of the light emitting element 1.

In the above, the light emitting device and the method of manufacturing the light emitting device according to the present invention have been described in the embodiments of the present invention, but the scope of the present invention is not limited to the above description, and it is to be widely interpreted based on the description of claims. In addition, various modifications and variations made based on the above description are also included in the scope of the present invention, as a matter of course.

What is claimed is:

1. A method of manufacturing a light emitting device, the method comprising:

forming a supporting body on a mounting surface side of a semiconductor structure corresponding to a plurality of semiconductor light emitting elements;

dividing the semiconductor structure and the supporting body into a plurality of singulated semiconductor light emitting elements each coupled to the supporting body;

arranging the singulated semiconductor light emitting elements coupled to the supporting body to be spaced apart from each other by a predetermined distance with a side of the supporting body facing downward; and forming a wavelength conversion layer to continuously cover an upper surface and side surfaces of at least one of the singulated semiconductor light emitting elements coupled to the supporting body, the wavelength conversion layer being continuously in contact with each of side surfaces of the supporting body and each of the side surfaces of at least one of the singulated semiconductor light emitting elements, wherein the forming of the wavelength conversion layer includes spraying a slurry provided by mixing particles of a wavelength conversion member and a thermosetting resin in a solvent onto the upper surface and the side surfaces of at least one of the singulated semiconductor light emitting elements coupled to the supporting body, so that a thickness of a lower portion of the wavelength conversion layer in contact with each of the side surfaces of the supporting body is smaller than a thickness of the wavelength conversion layer in contact with the upper surface and the side surfaces of at least one of the singulated semiconductor light emitting elements.

2. The method of manufacturing a light emitting device according to claim 1, wherein the spraying is performed in such a manner that a gas and the slurry are intermittently sprayed with a two-fluid nozzle capable of spraying gas and liquid.

3. The method of manufacturing a light emitting device according to claim 1, wherein the forming of the wavelength conversion layer includes forming a coating layer by spraying the slurry on the upper surface and the side surfaces of at least one of the singulated semiconductor light emitting elements coupled to the supporting body, and temporarily curing the coating layer by applying heat to the coating layer at a temperature lower than a curing temperature of the thermosetting resin for a predetermined length of time, the forming the coating layer and the temporarily curing the coating layer being repeated a plurality of times.

4. The method of manufacturing a light emitting device according to claim 1, wherein the slurry is provided in such a manner that a solution is made by dissolving a thermosetting resin containing at least one kind of resin selected from silicone resin, epoxy resin, fluorine resin, and hybrid resin thereof, in a solvent containing at least one kind of solvent selected from n-heptane, n-hexane, acetone, toluene, and isopropyl alcohol, and the wavelength conversion member in a granular form is mixed into the solution.

* * * * *